United States Patent [19]

So

[11] Patent Number: 4,990,848
[45] Date of Patent: Feb. 5, 1991

[54] DTMF RECEIVER

[75] Inventor: John L. W. So, Norcross, Ga.

[73] Assignee: Texas Instruments Incorporated, Dallas, Tex.

[21] Appl. No.: 471,655

[22] Filed: Jan. 22, 1990

Related U.S. Application Data

[63] Continuation of Ser. No. 325,621, Mar. 20, 1989, abandoned, which is a continuation of Ser. No. 206,156, Jun. 13, 1988, Pat. No. 4,833,399.

[51] Int. Cl.$^5$ .............................................. G01R 23/14
[52] U.S. Cl. .................................. 324/79 R; 364/485
[58] Field of Search ................ 324/77 R, 79 R, 79 D, 324/77 B, 77 D, 77 G, 78 R, 78 D; 364/484, 485, 487

[56] References Cited

U.S. PATENT DOCUMENTS

| | | | |
|---|---|---|---|
| 4,445,177 | 4/1984 | Bratt | 364/200 |
| 4,455,602 | 6/1984 | Baxter | 364/200 |
| 4,493,027 | 1/1985 | Katz | 364/200 |
| 4,525,780 | 6/1985 | Bratt | 364/200 |
| 4,833,399 | 5/1989 | So | 324/79 R |

*Primary Examiner*—Michael J. Tokar
*Attorney, Agent, or Firm*—B. Peter Barndt; Melvin Sharp; James T. Comfort

[57] ABSTRACT

A DTMF receiver (10) recognizes each of a plurality of multi-frequency tones, each tone centered on a predetermined standard frequency. Two digital bandpass filters (14, 16) each have four frequency bins, each frequency bin operating according to a recursive second-order transfer function for preferentially transmitting frequencies near the standard frequencies. Each frequency bin accumulates, for each of a plurality of sampling periods, respective spectral energy signals from the input signal. A temporal energy signal is derived from the spectral energy signals. For each bandpass filter (14,16), a time-domain test template generator (30) and a frequency-domain test template generator (34) are provided to generate time-domain and frequency-domain test templates. These test templates are input to an analyzer (38) that compares the templates against data-adaptive frequency-domain and time-domain reference templates.

42 Claims, 2 Drawing Sheets

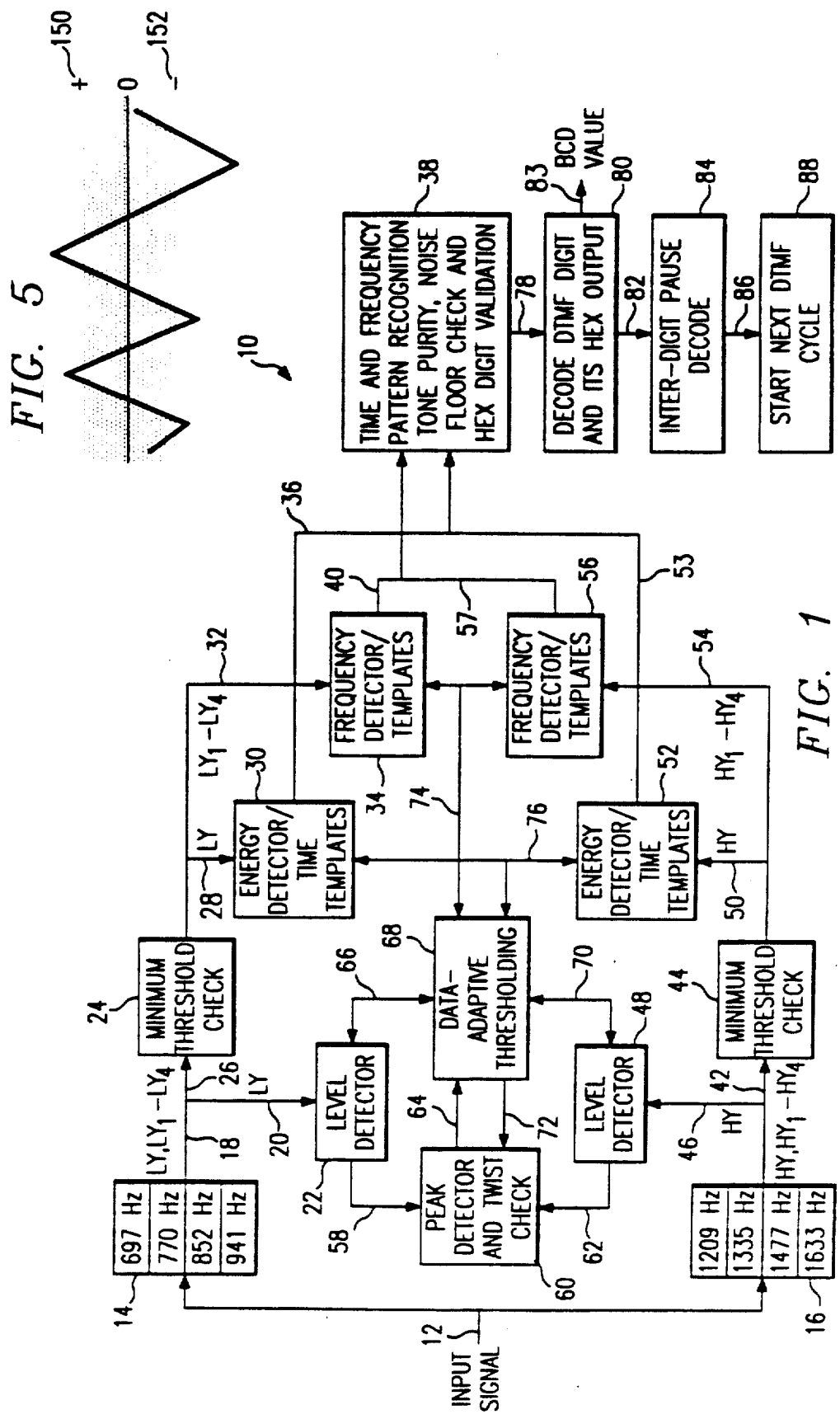

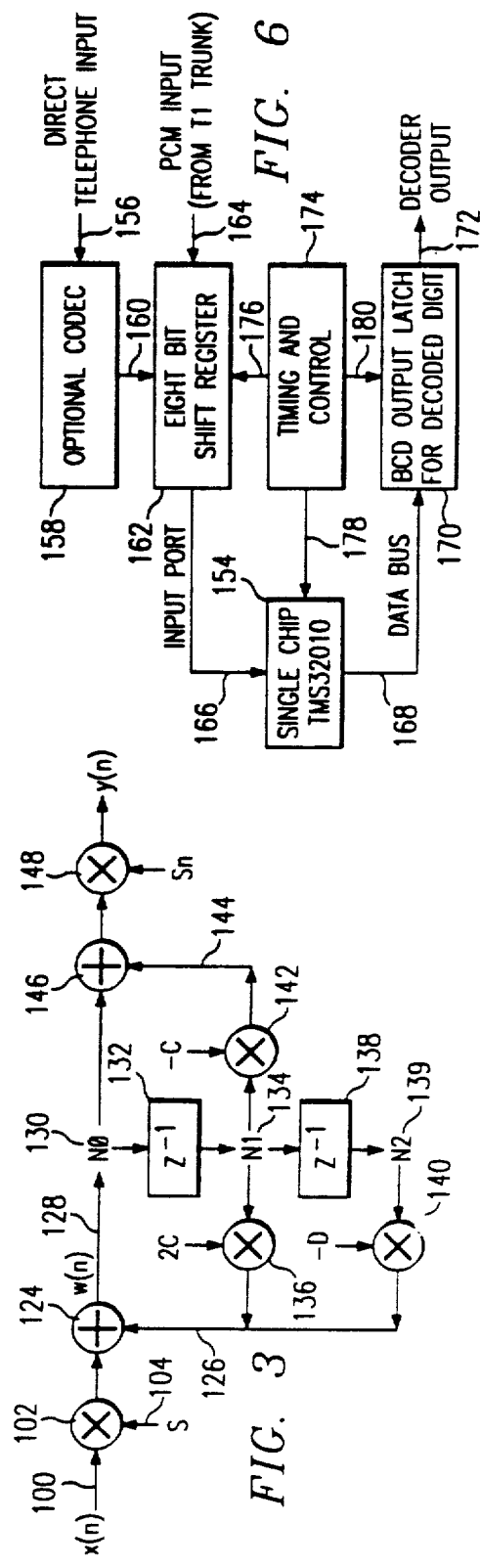
FIG. 6
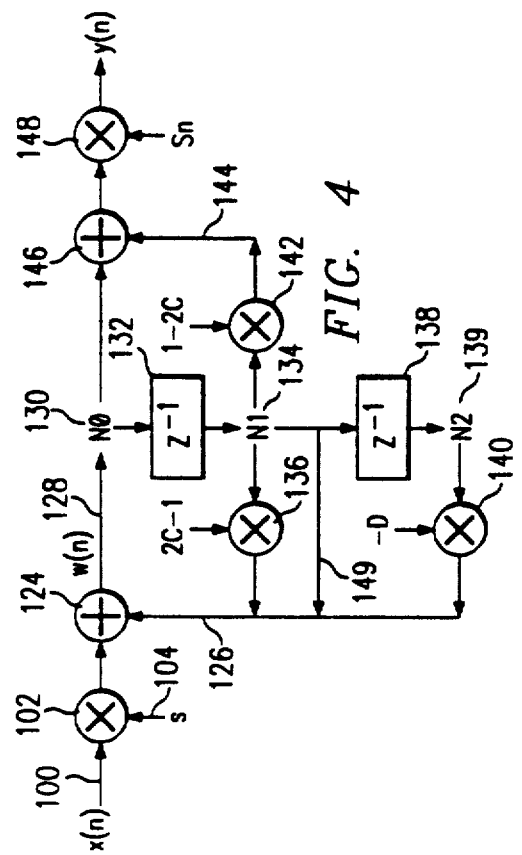
FIG. 4
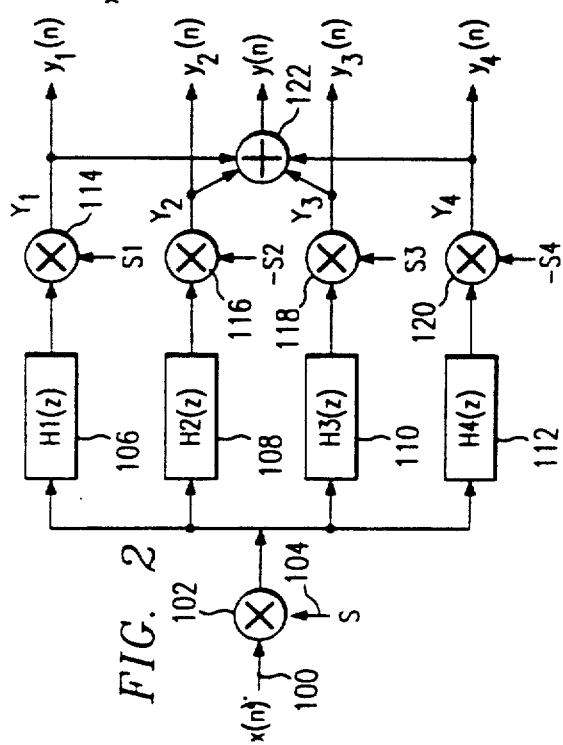
FIG. 2
FIG. 3

DTMF RECEIVER

This application is a Continuation, of application Ser. No. 325,621, filed 3/20/89, and now abandoned which is a continuation of Ser. No. 07/206,156 filed 6/13/88 and now U.S. Pat. No. 4,833,399.

TECHNICAL FIELD OF THE INVENTION

This invention relates in general to DTMF receivers, and more particularly to DTMF receivers incorporating digital bandpass filters.

BACKGROUND OF THE INVENTION

Introduced nearly three decades ago, DTMF (dual-tone multi-frequency) signaling has been widely used as a signaling method in telephone central offices, private branch exchanges, and private automatic branch exchange equipment. DTMF is also known under the mark TOUCH-TONE, a registered trademark of American Telephone and Telegraph Corporation. DTMF is also used for communications and in many other applications such as radio telephones, electronic tellers, banking/financial transactions via remote data entry, remote security and alarm activation systems, remote control systems, remote data-loggers, telemetry, toll-call restrictors, touch-tone to dial-pulse conversion and dial-pulse to touch-tone areas.

There are basically two types of DTMF receivers: analog and digital. Analog DTMF receivers typically require more support chips such as a CODEC and an eight-bit microcontroller. Digital DTMF receivers do not require as many support chips because the DTMF signal is already in digital form as PCM (pulse code modulation) data. Digital DTMF receivers can be incorporated into such digital signal processor chips as members of the Texas Instruments TMS320 family, which can handle PCM inputs without the use of a CODEC. The TMS320 can also act as a powerful controller.

Most existing DTMF decoders employ digital filtering techniques. Discrete Fourier transform, fast Fourier transform and other spectral and correlation techniques are both more time consuming and less desirable since standard DTMF tones are harmonically unrelated to each other.

Unfortunately, most digital filtering techniques require an excessively long cycle time for front-end filtering, leaving very little real time for post-detection digit validation and for other system software overhead. Also, filtering alone is not enough to distinguish between speech and valid DTMF digits in order to meet the AT&T standard specifications for digit simulations or talk-off performance. This is largely because speech signals have spectra spanning across the entire 4 KHz range. PCM data sampled at 8 KHz can only have a maximum bandwidth of 4 KHz in order to satisfy the sampling theorem. As a result, most commercial DTMF decoder chips do not perform well in digit simulations.

Therefore, a need has arisen for a digital DTMF receiver that can adequately discriminate between valid dual-tone pairs and other signal sources such as speech or noise, and further which has a sufficiently short cycle time to be useful for commercial applications.

SUMMARY OF THE INVENTION

According to one aspect of the invention, an apparatus for recognizing each of a plurality of multi-frequency tones is provided. Each of the tones is centered on a predetermined frequency. The apparatus includes a digital bandpass filter that has a plurality of frequency bins equal to the plurality of tones to be recognized. Each frequency bin preferentially transmits frequencies of the input signal near the predetermined frequencies, and accumulates, for each of a plurality of sampling periods, respective spectral energy signals from the preferentially transmitted frequencies. The filter further derives a temporal energy signal as a function of the preferentially transmitted frequencies for each of the sampling periods.

A time-domain test template generator is coupled to the filter for receiving the temporal energy signal and for generating a time-domain test template in response thereto. A frequency-domain test template generator receives the spectral energy signals for each of the sampling periods, and generates a frequency-domain test template in response thereto. An analyzer is coupled to the template generators to compare the test templates to at least one frequency-domain reference template and at least one time-domain reference template to determine the existence and identity of a predetermined multi-frequency tone.

Preferably, the apparatus comprises a DTMF receiver that includes a low-group bandpass filter and a high-group bandpass filter. Each filter applies a second-order recursive transfer function to preferentially filter frequencies near each of the four standard AT&T high group or low group frequencies, respectively. At least a high-group time-domain test template and a high-group frequency-domain test template are generated, as well as corresponding templates for the low frequency group. The frequency-domain test template is preferably created by counting the number of times the spectral energy signals exceed a predetermined, data-adaptive threshold for each frequency bin. This data adaptive threshold is preferably calculated as a function of the maximum of a plurality of the received temporal energy signal. A time-domain test template is preferably created as consecutive accumulations of the temporal energy signal for each of a plurality of sampling periods.

Preferably, the analyzer of the invention calculates a data-adaptive frequency-domain reference template in real time based on the peak spectral energy signal strength, and further performs tone purity and noise energy tests to determine the presence or absence of a valid DTMF digit. A data-adaptive time domain reference template is generated based on a predetermined acceptable transient response of the bandpass filter and consecutive accumulations of the temporal energy signal.

The present invention provides a significant technical advantage over conventional filtering systems in its use of an efficient and straightforward method for performing DTMF decoding. The present invention provides very efficient detection and recognition algorithms that reduce the digit detection and validation time down to a point where digital filtering becomes a feasible and commercially viable solution for DTMF decoding meeting AT&T specifications. It is believed that the combination of the filtering and data-adaptive pattern recognition aspects of the invention produce a DTMF receiver superior to existing DTMF decoding techniques. Finally, the invention can be applied to a commercially available DSP (digital signal processing) chip such as the TMS32010 to perform multi-channel DTMF decoding. All features provided by the invention are entirely software-programmable by changing the values of system parameters to adapt to the user's requirements.

BRIEF DESCRIPTION OF THE DRAWINGS

Further aspects of the invention and their advantages will be discerned by referring to the following detailed description when taken in conjunction with the drawings in which:

FIG. 1 is a schematic functional block diagram of a single-channel DTMF receiver according to the invention;

FIG. 2 is a signal flowgraph of either of a pair of eighth-order bandpass filters shown in FIG. 1;

FIG. 3 is a signal flowgraph of any of four second-order transfer functions of the frequency bins as shown in FIG. 2;

FIG. 4 is an alternative embodiment of any of the four second-order transfer functions as shown in FIG. 2;

FIG. 5 is an exemplary graph of signal strength over time showing the center clipping signal thresholding concept of the invention; and FIG. 6 is a schematic electrical block diagram showing one possible physical embodiment of the invention.

DETAILED DESCRIPTION

Referring first to FIG. 1, a schematic functional block diagram of a DTMF receiver according to the invention is shown generally at 10. An input signal is presented on input or T1 pathway 12 to a lower-tone bandpass filter 14 and in parallel to a higher-tone bandpass filter 16. The receiver of the illustrated embodiment is designed to recognize dual-tone multi-frequency signals produced by pressing a particular digit in a push-button telephone dial. According to dual-tone multi-frequency (DTMF) standard, a particular telephone button or digit is encoded into a pair of audio signals, one taken from a low group of frequencies illustrated within bandpass filter 14 and one taken from a high group of frequencies illustrated within bandpass filter 16. Therefore, the recognition of a pair of these discrete frequencies will allow the recognition of the encoded digit.

The design of bandpass filters 14 and 16 is an adaptation of the design described in the published 1978 Ph.D. thesis of the Applicant, "A Novel Design Technique and Hardware Implementation of Digital Filters For High-Speed Real-Time Digital Signal Processing", which is on file at the London University Library, London, Great Britain, and which is incorporated herein by way of reference. The function of bandpass filters 14 and 16 will be more particularly described in conjunction with FIGS. 2-4 to below Bandpass filter 14 puts out five different signals on the output line 18. A first output LY represents the relative intensity of the entire received and filtered input audio signal within a predetermined sampling period. Four other signals, $LY_1$-$LY_4$, represent relative intensities of the filtered input signal at or near each of four preselected frequencies, in the illustrated embodiment 697, 770, 852 and 941 Hertz. LY is derived as a function of $LY_1$-$LY_4$, as will be described in more detail in conjunction with FIG. 2.

The temporal energy signal LY is communicated via a path 20 to a level detector 22, while signals LY and $LY_1$-$LY_4$ are transmitted to a minimum threshold checker 24 by a path 26. The output of minimum threshold checker 24 is connected through path 28 to an energy detector and time-domain test template generator 30, and through a path 32 to a frequency detector and frequency-domain test template generator 34. Detector/generator 30 generates a time-domain test template that is transmitted through a path 36 to a validation block 38 that incorporates time and frequency pattern recognition, tone purity, noise floor check and hex digit validation functions. Frequency detector/test template generator 34 is operable to transmit a frequency-domain test template through path 40 to block 38.

The functional blocks subsequent to bandpass filter 14 are mirrored in the functional blocks subsequent to bandpass filter 16. Filter 16 generates a relative intensity signal HY from the intensity of the entire received and filtered input audio signal, and further generates four spectral energy signals $HY_1$-$HY_4$ corresponding to the relative intensities of the filtered input signal at or near 1209, 1335, 1477 and 1633 Hertz. HY is derived as a function of $HY_1$-$HY_4$. The output information from bandpass filter 16 is communicated through a path 42 to a minimum threshold checker 44 that is similar to minimum threshold checker 24. The temporal energy signal HY is communicated through a path 46 to a level detector 48. Minimum threshold checker 44 is operable to pass the HY signal through a path 50 to an energy detector/time domain test template generator 52 that is similar in its organization to time-domain test template generator 30. Output signals $HY_1$-$HY_4$ are communicated from the output of minimum threshold checker 44 through a path 54 to a spectral signal detector/frequency-domain test template generator 56 that is similar in its organization to detector/generator 34.

An output of level detector 22 is connected through a path 58 to a peak detector and twist checker 60. Likewise, an output of level detector 48 is connected through a path 62 to peak detector and twist checker 60. Peak detector/twist checker 60 compares the relative intensities of the signals received on paths 58 and 62 and outputs a flag on an output 64 to a data-adaptive threshold generator 68.

A path 66 connects level detector 22 to data-adaptive threshold generator 68. A similar path 70 connects level detector 48 to data-adaptive threshold generator block 68. Threshold generator 68 has one output that is connected through a path 72 to peak detector and twist checker 60, a second output connected via a path 74 to frequency detector/frequency-domain test template generators 34 and 56, and a third output connected through a path 76 to energy detector/time-domain test template generators 30 and 52.

Recognition block 38 has an output connected through a path 78 to a DTMF digit decoder 80. Decoder 80 has a BCD I/O port 83. Another output of DTMF digit decoder 80 is connected through a path 82 to an inter-digit pause decoder 84. Inter-digit pause decoder 84 has an output that is connected through a path 86 to a DTMF cycle initiator 88.

Turning now to FIG. 2, a flow graph corresponding to either bandpass filter 14 or bandpass filter 16 is schematically shown. The input signal x(n) is input on path 100 to scaling node 102. The signal has a scaler S applied to it through path 104 at this node. The scaled input signal is then input in parallel to each of four separate frequency bins or resonators, incorporating respective transfer functions $H_1(z)$-$H_4(z)$ and represented respectively by blocks 106, 108, 110 and 112. The output of these transfer functions are input to respective scaling nodes 114-120, to which magnitude scalers $S_1$, $-S_2$, $S_3$ and $-S_4$ are respectively applied. The application of scaling factors $S_1$-$S_4$ yields frequency intensity outputs $y_1(n)$-$y_4(n)$. These outputs are individually output to the next function of receiver 10, and in addition are summed at node 122 to produce overall value $y(n)$.

The transfer function for each second-order frequency bin or section 106-112 is given below:

$$H(z) = \frac{1 - e^{-aT}\cos(bT)z^{-1}}{1 - 2e^{-aT}\cos(bT)z^{-1} + e^{-2aT}z^{-2}}$$

Substituting $C = e^{-aT}\cos bT$ and $$D = e^{-2aT},$$

the transfer function can be reduced to the following:

$$H(z) = \frac{1 - Cz^{-1}}{1 - 2Cz^{-1} + Dz^{-2}}$$

In the above equations, $e^{-aT}$ is the pole radius of each complex pole pair. a is equal to half of the bandwidth of each frequency bin. b is the center frequency of each frequency bin 106-112, and T is the sampling period.

The signal flowgraph of each second order bin 106-112 is schematically shown in FIG. 3. In FIGS. 2-4, like numbers identify like nodes and functions wherever possible. As before, $x(n)$ is input on path 100 to a node 102, at which an input scaling factor (S) is applied through path 104. The scaled signal is then input to a summation node 124 where it is summed with components provided from a path 126. A summed output proceeds on a path 128 to a node 130 and further on to a summation node 146. The signal at node 130 is fed through a first delay 132 to node 134. The signal at node 134 is scaled by quantity (2C) at node 136 and summed through path 126 to the input at node 124. The signal at node 134 is also subjected to a further delay at 138 to appear at a node 139. This twice-delayed signal is scaled at node 140 by (−D) and is added back to the input through path 126.

The once-delayed signal at node 134 is also scaled at node 142 by quantity (−C). This quantity then is input by path 144 to summation node 146. The output of summation 146 is scaled at node 148 by an output scaler $S_n$ to yield the output $y(n)$.

FIG. 4 illustrates an alternative embodiment of one second-order bin or resonator. The shown flow graph is a modification in order to implement 32 bits of arithmetic precision and to avoid number representation and storage problems of the bin structure shown in FIG. 3. These problems occur when the value for scaling factor (C) closely approaches one. The following substitute transfer function avoids these number representation problems:

$$H(z) = \frac{1 + (1 - 2e^{-aT}\cos bT)z^{-1}}{1 - (2e^{-aT}\cos bT - 1 + 1)z^{-1} + e^{-2aT}z^{-2}}$$

Again substituting in C and D, this equation reduces to $$H(z) = \frac{1 + (1 - 2C)z^{-1}}{1 - (2C - 1 + 1)z^{-1} + Dz^{-2}}$$

The resulting flow graph shown in FIG. 4, is essentially the same as that shown in FIG. 3, except that the scaling quantity (2C) in FIG. 3 is replaced by a scaling quantity (2C−1), and the scaling quantity (−C) is replaced by a scaling quantity (1−2C). An extra path 149 is also added as an input to the summation mode 124.

HARDWARE IMPLEMENTATION

FIG. 6 is one possible schematic electrical block diagram of a physical implementation of a DTMF receiver according to the invention. The decoder system illustrated is a single-channel system, and can easily be expanded to multiple channels. The system is built around a TMS32010 digital signal processor chip 154. Chip 154 is programmed with the computer program to be described in more detail below. This program is written in TMS32010 assembly language.

A direct telephone input 156 is connected to an optional CODEC 158, which in turn has an output 160 that is input into an eight-bit shift register 162. In the place of or in addition to direct telephone input 156, a PCM input 164 can be provided from a T1 digital carrier trunk. Shift register 162 is used to convert the serial PCM input data to parallel data that can be placed on input port 166 of chip 154. Recognized digits are output on data bus 168 from chip 154 to a BCD output latch 170 for storing the decoded digit. Latch 170 has a decoder output 172.

A timing and control block 174 is connected through paths 176, 178 and 180 respectively to shift register 162, chip 154 and output latch 170. Timing and control block 174 provides essential timing and clock signals to ensure proper operation of the system hardware.

OPERATION

The operation of the receiver of the invention can best be described with particular reference to FIG. 1. The signal input on input 12 is preferably subsampled at 4 KHz and is appropriately scaled.

To do this, the input 8 KHz PCM data are decimated without an anti-aliasing filter. The subsampling process of the PCM input creates aliasing for speech samples only. The intentional aliasing thus produced will also help in reducing digit simulations by non-DTMF signals. This is due to the fact that speech has a bandwidth wider than 2 KHz (the folding frequency of a digital system sampling at 4 KHz) and extends to 4 KHz and beyond in voiced segments. For unvoiced segments, speech appears as a wide band Gaussian noise that is only a band-limited by the input codec or PCM bandwidth. The net result of this aliasing effect on the speech signal is that more of the higher frequency speech energy will fall into the individual frequency bins. Under this condition, the speech signal will take on a different identity than that of a dual-tone DTMF pair, which has most of its energy concentrated in one bin per frequency group.

On the other hand, since all DTMF frequencies (less than 1633 Hz) are below 2 KHz, the DTMF samples are sampled above the theoretical minimum sampling rate, resulting in no aliasing effects. This is also true even when the DTMF tones are pulsed with 40 milliseconds on/off time periods. In this last case, the frequency response of the tone pair will be made up of narrowband sinc functions centered at the respective tone frequencies. The main lobes of these sinc functions are normally very visible to the frequency detectors while their side lobes are relatively "masked" out due to the frequency separation or resolution of the frequency bins.

Signal 12 is applied to bandpass filter 14, which in the preferred embodiment consists of four second-order bins that are tuned to the four standardized DTMF low frequencies. Each bin incorporates a second-order recursive filter transfer function of the type described in conjunction with FIGS. 3 and 4. Similarly, the signal is input into bandpass filter 16, which has four second-order bins that are tuned to each of the four standard high DTMF frequencies. The bandpass filters 14 and 16 will reject all frequency components of the input signal that are not at or near the specified frequencies. Preferably, the bandwidth tolerance around each specified frequency falls in the range of $+/-1.5\%$ to $+/-3.5\%$.

Bandpass filter 14 outputs five digital numbers for each sampling period. The sampling period in the illustrated embodiment is one-fourth of a millisecond. A value LY is derived as a function of the filtered energy signals $LY_1-LY_4$ of the four frequency bins.

The value LY is passed to the minimum threshold checker 24 to determine whether there is sufficient energy to warrant further processing. If LY is not of a certain predetermined magnitude, minimum threshold checker 24 will issue a flag that will abort the rest of the DTMF signal analysis. When such a flag is issued, system 10 will await the input of the next sample.

Value LY is also transmitted via path 20 to a level detector 22. Level detector 22 uses LY to determine the magnitude of the input signal as filtered by low-tone bandpass filter 14. This magnitude is applied through path 58 to peak detector and twist checker 60 and the data-adaptive threshold generator 68 through path 66.

Value LY is also applied through paths 18, 26 and 28 to the energy detector/time test template generator 30. Detector 30 will accumulate the received temporal energy signals for each of at least three ten-millisecond intervals. These consecutive energy accumulations $ELY_1$, $ELY_2$ and $ELY_3$ constitute a time-domain test template, which will be transmitted via path 36 to the time and frequency pattern recognition block 38. In an alternative embodiment, energy accumulations $ELY_1$, $ELY_2$, $ELY_3$ and $ELY_4$, from four adjacent ten-millisecond intervals, could be used to generate the test template, but this has been found not to be necessary for meeting standard DTMF tone recognition requirements.

Frequency bin output signals $LY_1-LY_4$ are transmitted through paths 18, 26 and 32 to a frequency domain detector/test template generator 34. Frequency domain detector 34 samples each of the signals $LY_1-LY_4$ each 250 microseconds, and counts the number of times that these signals exceed a calculated data-adaptive threshold inside a 40-millisecond period. One count will be accumulated for $LY_1$, a second count will be accumulated for $LY_2$, a third count will be accumulated for $LY_3$ and a fourth count will be accumulated for $LY_4$. Frequency detector 34 thus generates a frequency domain template that consists of four counts, one count for each of the four frequency bins of bandpass filter 14.

The processing of the input signal through high-tone bandpass filter 16 is similar to the processing described above for lower-tone bandpass filter 14. Bandpass filter 16 will generate an overall energy intensity value HY and particular frequency bin output values $HY_1-HY_4$ that correspond to each of the standard DTMF high frequencies. Value HY is transmitted via path 46 to level detector 48. The magnitude of HY is in turn fed through path 62 to peak detector and twist checker 60, and also to data-adaptive threshold generator 68 through path 70.

Peak detector and twist checker 60 samples HY and LY a plurality of times, such as eight successive times, and chooses a peak HY value and a peak LY value. Peak detector and twist checker 60 then compares the peak magnitude of LY to the peak magnitude of HY. The difference between these magnitudes, called "twist", must not exceed certain predetermined specifications. If this difference does exceed a certain predetermined limit, the twist checker 60 will issue an abort flag and the system will be reset to receive the next input signal.

The peak magnitudes of HY and LY are also used by data adaptive threshold generator 68 to generate thresholds which in the illustrated embodiment are simple percentages of these magnitudes. Thresholding block 68 is important because the input signal can have a dynamic range of approximately 25 decibels. In the illustrated embodiment, percentages of the peaks are used to establish higher-tone and lower-tone thresholds. The higher-tone threshold is transmitted through path 74 to higher-tone detector 56, and the lower-tone threshold is transmitted through path 74 to lower-tone detector 34. A third threshold is derived from the peak values of both HY and LY, and is transmitted to both time-domain template generators 30 and 52 on path 76. In an alternative embodiment, separate thresholds could be generated for each frequency component and each time-domain generator, but for standard telephone applications this has been determined not to be necessary.

Value HY is transmitted through paths 42 and 50 to detector 52, where it is used to generate a time-domain high-frequency test template that in turn is transmitted through path 53 to recognition block 38. Components $HY_1-HY_4$ are transmitted through paths 42 and 54 to frequency detector/test template generator 56, which uses these components to generate a frequency-domain test template similar to the one generated for the low frequencies by generator 34. The frequency-domain test template is communicated through path 57 to recognition block 38.

Recognition block 38 thus receives two time domain test templates and two frequency-domain test templates for each valid unaborted 40-millisecond interval. Recognition block 38 then compares these templates against respective time- and frequency-domain reference templates to identify whether a valid DTMF signal has been received. The time-domain reference templates are sets of energy accumulations derived from the corresponding energy accumulations in the test templates and known ratios $ELY_1/ELY_2$, $ELY_2/ELY_3$, etc. of an acceptable bandpass filter transient response. Each set has the same number of ratios as the time-domain test template it is compared against. Block 38 preferably contains the following checks of the signal.

1. Adaptive Time-Profile Check.

Six of the eight 10 msec. components of the two 40 msec. time-domain test templates are compared with known reference templates by way of a ratio test of the time-domain transient responses of the bandpass filters. Individually tailored reference thresholds are assigned to each of the eight time bins for this comparison process. The decision-making process is dependent on predetermined acceptable transient filter responses to DTMF tone and speech inputs.

2. Data-Adaptive Frequency Domain Reference Template Generation.

Each frequency-domain test template will have a peak value in one of its frequency bins that exceeds the values in the other frequency bins. This peak value, or main lobe of the signal, is detected and used to generate the frequency-domain reference thresholds discussed below.

3. Data-Adaptive Noise Floor Generation.

A data-adaptive noise floor is generated by block 38 based on the energy of the main lobe or peak value of each DTMF frequency-domain test template. Associated with this adaptive noise floor are two pairs of thresholds. A pair of thresholds is assigned for the maximum allowed noise energy in the high- and low-frequency groups for a given signal-to-noise ratio. Another pair of maximum "spillover" thresholds are also generated as a function of the main lobe. These spillover thresholds are issued for the maximum allowed energy in each side lobe, or non-peak frequency bin, of the frequency test templates.

4. Tone Purity Check.

A check of the individual second-order frequency bins must also indicate that there is only one distinct frequency component present in each of the two frequency-domain test templates. To achieve this, the spillover thresholds generated above are applied respectively to the low-frequency and the high-frequency group of bins. A further check is performed to make sure that at least two of the side lobes per frequency domain templates have energies below a certain threshold. If this is not the case, a noise energy test is next conducted.

5. Noise Energy Test.

For each frequency group, contingent on the result of the tone purity check, a noise energy check may be performed using the data-adaptive noise energy thresholds generated in step 3. This check sums the three non-peak counts of the frequency-domain test template and compares the sum against a calculated threshold. If the sum exceeds this threshold, the current digit is rejected.

If the test templates meet the above tests block 38 will validate that a DTMF digit consisting of a tone pair has been received. The output of block 38 will cause block 80 to generate a decoded BCD value that corresponds to the detected tone pair. This BCD value will be output to an I/O port 83.

Time and frequency pattern recognition block 38 is also connected through paths 78 and 82 to an inter-digit pause decoder 84. This block is operable to verify that the energy of a dual-tone digit has died down to a sufficient level, typically within six milliseconds of the initial tone decay. At this stage, in the illustrated embodiment, decoder 84 starts a 34-millisecond active time delay to complete the inter-digit interval of 40 milliseconds. Upon sensing such an inter-digit interval, block 84 will send a signal on path 86 to initiator 88 to re-initialize the next DTMF reception cycle.

TIMING AND CONTROL

If no energy is detected over a period of eight samples, a line dropout condition is recognized and the system is reset. When energy is detected, a 40-millisecond software timer is started. The energy detector and the frequency detector embodied in chip 154 will accumulate information over this 40-millisecond interval. A tone may be detected at the end of this period.

Also, the tone must be tracked since it could last for much longer than 40 milliseconds. A tone longer than 40 milliseconds should not cause multiple DTMF decoding operations as this would result in the detection of multiple key strokes. The software timing and control further ensure that there is an inter-digit pause or gap between the tones of at least 40 milliseconds.

FIG. 5 illustrates the manner in which signals are counted above (and below) a certain threshold. The input signal received on input 12 has both high and low peaks. Therefore, HY, $HY_1$-$HY_4$, LY and $LY_1$-$LY_4$ may take either positive or negative values. The thresholding data supplied by data-adaptive threshold generator 68 sets a positive limit shown at 150 at FIG. 5, and further sets a mirror-image negative limit at 152. The points between these positive and negative limits will not be considered by detector/template generators 30, 34, 52 and 56.

SOFTWARE IMPLEMENTATION

Most of the functions of the DTMF receiver are provided through programming a TMS32010 chip with appropriate software. A preferred source code listing is set out below, preceded by a description of the program sections by their subtitles.

The following program sections are used to initialize the program variables and to set up the RAM of the TMS32010 chip:
DATA RAM MAP
SYSTEM RESET VECTOR
SYSTEM INITIALIZATION TABLE
DTMF DIGIT DECODE TABLE
INITIALIZE SYSTEM DATA RAM AND CONSTANTS
INITIALIZE SYSTEM HEX DIGIT DISPLAY
INITIALIZE DTMF FLAGS AND COUNTERS
INITIALIZE ADAPTIVE ENERGY FRAMES
INITIALIZE ADAPTIVE THRESHOLDS

DATA RAM MAP

This section reserves space in the TMS32010 DATA RAM for all of the system variables and labelled constants used in each module.

SYSTEM INITIALIZATION TABLE

This section is a table of initial values to be stored in the locations reserved for them in the DATA RAM MAP upon system initialization.

DTMF DIGIT DECODE TABLE

This table is a table of values that is indexed in assigning a digit value to a decoded DTMF.

SYSTEM INITIALIZATION

This section of the code transfers the values in the system initialization table in program memory to the data memory locations declared in the data RAM map.

THRESHOLD INITIALIZATION

This section initializes the adaptive thresholds and energy frames.

CODEC INPUT BIOWAIT LOOP

The program waits here for an input sample from the CODEC. Note that every other sample is discarded. By this method, the processing rate of the DTMF system is effectively 4 KHz, even though the CODEC is running at 8 KHz.

DTMF TONE DETECTION AND ASSOCIATED PROCESSING

This section comprises the bulk of the DTMF decoding routine and consists of eleven sub-modules that perform a variety of functions. Each of these sub-modules is described below.

CALL HIGH/LOW GROUP FILTERS

This sub-module calls the bandpass filter subroutines (later described) and is represented in FIG. 1 by filters 14 and 16.

TRACK INPUT SIGNAL ENERGY

This function is likewise represented in FIG. 1 by filters 14 and 16. This section tracks the input signal energy and the outputs of the filters are saved for use later.

TRACK INPUT SIGNAL SWING/PEAK INFORMATION

This sub-module is represented in FIG. 1 by detectors 22, 48 and 60, and saves the low-group peaks and the high-group peaks in variables ADJL and ADJH respectively. The peaks will be later used in calculation of the data-adaptive thresholds.

FRAME ENERGY PROCESSING FOR FIRST 40 MS. DURATION

This sub-module corresponds to detector/generators 30 and 52, and examines the four 10 msec. frames which make up a 40-millisecond period. The energy in each frame is stored in locations ELY1-ELY4 and EHY1-EHY4 respectively for the low-group and the high-group signals.

TWIST TEST

This sub-module is incorporated into block 60 of FIG. 1, and compares the two peak values to verify that their difference (twist) is less than a preset maximum value. Optionally, this twist test can be modified to check on other twist limits. If the twist threshold is exceeded, the tones are considered to be invalid and an appropriate flag is issued.

MINIMUM INPUT SIGNAL LEVEL TEST

This sub-module is represented in FIG. 1 by blocks 24 and 44, and compares the peaks against a fixed minimum level MINTHR, which can be set to any desired value. In the program set forth, MINTHR is set to $-25$ dB.

CALCULATE DATA ADAPTIVE THRESHOLDS FOR TONES

This sub-module is represented in FIG. 1 by blocks 30, 34, 52 and 56. This sub-module employs an adaptive thresholding technique to adapt to dynamic line conditions and varying signal strengths. The thresholds are updated after monitoring the peak levels over a number of samples. One level of thresholds is used for the eighth-order results input into blocks 30 and 52 (FIG. 1), and two other levels of thresholds are used for the frequency bin results input into blocks 34 and 56. The adaptive thresholds calculated with the multiplicative constant THRADJ at this point in the detection process are used first for the determination of tone presence in the low-group and the high-group. Next, the other adaptive thresholds are used to sort the second-order frequency bin outputs by updating the respective frequency counters.

CHECK FOR THE END OF DTMF TRANSMISSION

This sub-module is represented by block 84 in FIG. 1. Between each valid DTMF character received, there is required a minimum 40-millisecond inter-digit pause. During this period, the DTMF receiver does not decode tones. To implement this requirement, one may either simply halt DTMF processing for the required period of time after each valid decode, or, one may continue to process the incoming signal and make sure that there exists an inter-digit pause of no DTMF transmission.

THRESHOLD DTMF FREQUENCY BIN OUTPUTS

This sub-module is incorporated into block 38 of FIG. 1. If the tone has been present for a minimum period of 40 milliseconds, the program will check the contents of each of the frequency counters to determine which tones are present. THRHL is the minimum count for tone present, and is initialized to 60. Threshold LOLIM is the maximum spillover account for the low group, and is initialized to zero. Threshold HILIM is the maximum spillover count for the high frequency group, and is likewise initialized to zero. The maximum spillover counts are used to make sure that the true DTMF tones will not exceed the maximum allowed side lobe values for the low-frequency group and the high-frequency group. In the case of speech and other non-DTMF signals on the telephone line, these values will be exceeded. By changing these present counts, the user can easily relax or tighten the DTMF receiver tone acceptance criteria.

DTMF DIGIT DECODER

This module is incorporated into block 38 of FIG. 1, and does the decoding and checking for the presence of DTMF signals. A discussion of each sub-module in this module follows.

LOW-GROUP TONE DECODE

An adaptive profile check is done for the four low-group frequency bins. This adaptive check is based on the energy stored in the first three frames of the 40-millisecond DTMF transmission. The test compares the energy in these frames to see if there has been too much change between them compared to reference frames. If there is too much change, then the frequency bin is rejected as not having any DTMF energy present.

CALCULATE ADAPTIVE NOISE FLOOR/ENERGY FOR LOW-GROUP

The adaptive noise floor is calculated based on the tone count TESTL.

CHECK FOR PRESENCE OF ONLY ONE TONE IN LOW-GROUP

If there is only one frequency counter in each group that meets the minimum requirements of a DTMF tone, the corresponding hex digit is output to the output data bus 168 (FIG. 6) of the TMS32010.

TESTS OF THE DTMF RECEIVER

The single-channel DTMF decoder of the invention performed well on all of the MITEL tests using the CM7291 MITEL tape. Most of the measured parameters are digitally controlled and may be modified to improve the decoder performance should it be required to operate in extreme conditions. A variation in each parameter is simply performed by modifying a software constant in the code. The results of the MITEL rest tape are as follows:

| MITEL TEST | |
|---|---|
| Immunity to 1 KHz tone | Checked |
| Valid decodes (16 digits) | 160 out of 160 |
| Center frequency offset | +/− 1.7% to 2.6% |
| Twist acceptance | +4dB to −8dB (minimum) |
| Dynamic range | 25dB (programmable) |
| Decode or guard time | 30 milliseconds |
| Signal-to-noise performance: | |
| −24 dB: | 1000 out of 1000 |
| −18 dB: | 1000 out of 1000 |
| −12 dB: | 1000 out of 1000 |
| Talk-off test: | 3 hits |

The signal-to-noise performance test consisted of three sections where 1000 tone pairs were transmitted in the presence of Gaussian noise. The signal-to-noise ratio was gradually reduced from −24 dB to −12 dB. The receiver performed well at all tested levels, and may even be able to decode beyond the −12 dB signal-to-noise ratio.

The results of the standard AT&T digit simulation test are given below.

| | DIGITS | | | | |
|---|---|---|---|---|---|
| | 1 | A-D | *,# | 0-9 | 0-F |
| Side | | | | | |
| 1: | 22 | 9 | 1 | 55 | 64 |
| 2: | 26 | 1 | 0 | 48 | 49 |
| 3: | 32 | 6 | 1 | 71 | 78 |
| 4: | 25 | 6 | 2 | 51 | 59 |
| 5: | 15 | 10 | 2 | 38 | 50 |
| 6: | 31 | 9 | 0 | 52 | 61 |
| TOTAL: | 151 | 41 | 6 | 315 | 362 |

The invention has been described as embodied in a single-channel DTMF receiver for the recognition of telephone digits. The invention however, may also be used to convert from DTMF to pulse-dialing and vice versa, and to convert from DTMF to MF and vice versa. The invention may further be used in multi-line DTMF decoding.

Apart from telephone digit recognition, the receiver of the invention can be used in secured financial and computer transactions; credit checking via the public telephone network; remote data logging and remote terminals for data entry; automatic teller machines; remote home and plant control; and as an alternative to a MODEM and as a portion of an unauthorized call interceptor. The invention can further be used to validate legal accesses and intercept legal attempts as a security checker; as an activator for automatic answering services and transactions and for vocoding in store-and-forward systems.

The system is further useful in the design of multi-line MF encoding and decoding, multi-line DTMF tone encoding, and as a line monitor and test signal generator.

The invention can further be used in digital speech interpolation, speech recognition and speech compression, speech store-and-forward and voice mail, speech detection and call routing, voice dial/automatic call placement and teleconferencing.

In summary, a digital DTMF receiver has been described. The system incorporates a pair of eighth-order digital bandpass filters that in turn supply peak intensity information to frequency domain template generators and time domain template generators. These test templates are generated using data-adaptive thresholding. The templates are then tested to detect the occurrence of a valid dual tone pair.

While a preferred embodiment and its advantages has been described in the above detailed description, the invention is not limited thereto but only by the spirit and scope of the appended claims.

HIGH-GROUP TONE DECODE, CALCULATE ADAPTIVE NOISE FLOOR/ENERGY FOR HIGH-GROUP, CHECK FOR PRESENCE OF ONLY ONE TONE IN HIGH-GROUP

These sub-modules are identical to the corresponding low-group sub-modules discussed immediately above with appropriate changes in the variable names.

SUBROUTINE H DIGIT (LOOK UP DECODED HEX DIGIT FROM HEX TABLE)

This subroutine uses a table to look up the hex digit decoded from the table.

SUBROUTINE JB EDIT (OUTPUT DECODED HEX DIGIT)

This subroutine outputs the hexadecimal digit to display hardware.

SUBROUTINE HILOW (LOW-GROUP/HIGH-GROUP BANDPASS FILTERS)

This subroutine corresponds to blocks 14 and 16 in FIGURE 1, and contains the bandpass filters for the low- and high-frequency groups. The filter taps provide the second-order outputs and the eighth-order results are obtained in this subroutine also.

SUBROUTINE CODEC (CODEC INPUT ROUTINE)

This subroutine reads in the PCM data from the CODEC and performs the logarithmic-to-linear 13-bit two's complement conversion using the CODEC-to-linear conversion table.

SOURCE CODE

```
****************************************************************
*                                                              *
*      A TMS32010-BASED ADVANCED DTMF DETECTOR/DECODER         *
*                                                              *
*        COPYRIGHT 1988 BY TEXAS INSTRUMENTS INCORPORATED      *
*                                                              *
****************************************************************
*
            IDT  'ADTMF'
            TITL 'ADVANCED DTMF DECODER RELEASE 1.2'
            OPTION XREF
*
****************************************************************
*                                                              *
*      THE CENTRE FREQUENCIES OF THE DTMF BINS ARE:            *
*                                                              *
*        697 HZ   (a=8.0)       1209 HZ   (a=12.0)             *
*        770 HZ   (a=9.0)       1336 HZ   (a=14.0)             *
*        852 HZ   (a=10.0)      1477 HZ   (a=16.0)             *
*        941 HZ   (a=11.0)      1633 HZ   (a=18.0)             *
*                                                              *
****************************************************************
*
            DORG 0
*
****************************************************************
*           DATA RAM MAP                                       *
****************************************************************
*
*           CONSTANTS AND COUNTERS
*
ONE         DATA 0      ARITHMETIC CONSTANT 1
LOGTBL      DATA 0      LOCATION FOR CODEC TABLE
PAUSE       DATA 0      FLAG FOR CHECKING INTER-DIGIT PAUSE
STOP        DATA 0      FLAG FOR END OF 10MS FILTER TRANSIENTS
GAP         DATA 0      FLAG FOR END OF 40MS DTMF TONE BURST
THRADJ      DATA 0      THRESHOLD ADAPTATION PARAMETER (8TH H/L)
THRADL      DATA 0      THRESHOLD ADAPTATION PARAMETER (2ND LG)
THRADH      DATA 0      THRESHOLD ADAPTATION PARAMETER (2ND HG)
MINCNT      DATA 0      SAMPLE COUNT FOR LINE ENERGY CHECK
MINTHR      DATA 0      THRESHOLD FOR MINIMUM SIGNAL ENERGY
SIGCNT      DATA 0      SIGNAL COUNTER FOR TRACKING DTMF TONE
SCNT        DATA 0      MINIMUM SIGNAL COUNT FOR DTMF ON-TIME
CNTR        DATA 0   -  TEMPORARY SYSTEM COUNTER
CNTR1       DATA 0      TEMPORARY SYSTEM COUNTER
CNTR2       DATA 0      TEMPORARY SYSTEM COUNTER
*
```

```
*       RAM FOR FIXED AND ADAPTIVE THRESHOLDS
*
THRSH8  DATA 0      HIGH-GROUP/LOW-GROUP FILTER THRESHOLD
THRHI   DATA 0      HIGH-GROUP FREQUENCY BIN THRESHOLD
THRLO   DATA 0      LOW-GROUP FREQUENCY BIN THRESHOLD
ADJL    DATA 0      LOW-GROUP THRESHOLD ADJUST VALUE
ADJH    DATA 0      HIGH-GROUP THRESHOLD ADJUST VALUE
THRHL   DATA 0      MINIMUM COUNT FOR TONE PRESENT
LOLIM   DATA 0      MAXIMUM SPILLOVER COUNT FOR LOW-GROUP
HILIM   DATA 0      MAXIMUM SPILLOVER COUNT FOR HIGH-GROUP
*
*       RAM FOR INPUT AND SCALING CONSTANT
*
X       DATA 0      SCALED INPUT DATA.
*
*       RAM FOR LOW-GROUP BANDPASS FILTER
*
LS      DATA 0      LOW-GROUP BANDPASS INPUT SCALER
LS1     DATA 0      LOW-GROUP #1 FREQUENCY BIN OUTPUT SCALER
LS2     DATA 0      LOW-GROUP #2 FREQUENCY BIN OUTPUT SCALER
LS3     DATA 0      LOW-GROUP #3 FREQUENCY BIN OUTPUT SCALER
LS4     DATA 0      LOW-GROUP #4 FREQUENCY BIN OUTPUT SCALER
*
L1C     DATA 0      LOW-GROUP BANDPASS FILTER COEFFICIENT #1
L1D     DATA 0      LOW-GROUP BANDPASS FILTER COEFFICIENT #2
L2C     DATA 0      LOW-GROUP BANDPASS FILTER COEFFICIENT #3
L2D     DATA 0      LOW-GROUP BANDPASS FILTER COEFFICIENT #4
L3C     DATA 0      LOW-GROUP BANDPASS FILTER COEFFICIENT #5
L3D     DATA 0      LOW-GROUP BANDPASS FILTER COEFFICIENT #6
L4C     DATA 0      LOW-GROUP BANDPASS FILTER COEFFICIENT #7
L4D     DATA 0      LOW-GROUP BANDPASS FILTER COEFFICIENT #8
*
LY      DATA 0      LOW-GROUP BANDPASS FILTER OUTPUT
LY1     DATA 0      LOW-GROUP #1 FREQUENCY BIN OUTPUT
LY2     DATA 0      LOW-GROUP #2 FREQUENCY BIN OUTPUT
LY3     DATA 0      LOW-GROUP #3 FREQUENCY BIN OUTPUT
LY4     DATA 0      LOW-GROUP #4 FREQUENCY BIN OUTPUT
*
L1N1    DATA 0      LOW-GROUP BANDPASS FILTER DELAY #1
L1N2    DATA 0      LOW-GROUP BANDPASS FILTER DELAY #2
L2N1    DATA 0      LOW-GROUP BANDPASS FILTER DELAY #3
L2N2    DATA 0      LOW-GROUP BANDPASS FILTER DELAY #4
L3N1    DATA 0      LOW-GROUP BANDPASS FILTER DELAY #5
L3N2    DATA 0      LOW-GROUP BANDPASS FILTER DELAY #6
L4N1    DATA 0      LOW-GROUP BANDPASS FILTER DELAY #7
L4N2    DATA 0      LOW-GROUP BANDPASS FILTER DELAY #8
*
*       RAM FOR HIGH-GROUP BANDPASS FILTER
*
HS      DATA 0      HIGH-GROUP BANDPASS INPUT SCALER
HS1     DATA 0      HIGH-GROUP #1 FREQUENCY BIN OUTPUT SCALER
HS2     DATA 0      HIGH-GROUP #2 FREQUENCY BIN OUTPUT SCALER
HS3     DATA 0      HIGH-GROUP #3 FREQUENCY BIN OUTPUT SCALER
HS4     DATA 0      HIGH-GROUP #4 FREQUENCY BIN OUTPUT SCALER
*
H1C     DATA 0      HIGH-GROUP BANDPASS FILTER COEFFICIENT #1
H1D     DATA 0      HIGH-GROUP BANDPASS FILTER COEFFICIENT #2
```

```
    H2C     DATA 0      HIGH-GROUP BANDPASS FILTER COEFFICIENT
    *                   #3
    H2D     DATA 0      HIGH-GROUP BANDPASS FILTER COEFFICIENT
    *                   #4
    H3C     DATA 0      HIGH-GROUP BANDPASS FILTER COEFFICIENT
    *                   #5
    H3D     DATA 0      HIGH-GROUP BANDPASS FILTER COEFFICIENT
    *                   #6
    H4C     DATA 0      HIGH-GROUP BANDPASS FILTER COEFFICIENT
    *                   #7
    H4D     DATA 0      HIGH-GROUP BANDPASS FILTER COEFFICIENT
    *                   #8
    *
    HY      DATA 0      HIGH-GROUP BANDPASS FILTER OUTPUT
    HY1     DATA 0      HIGH-GROUP #1 FREQUENCY BIN OUTPUT
    HY2     DATA 0      HIGH-GROUP #2 FREQUENCY BIN OUTPUT
    HY3     DATA 0      HIGH-GROUP #3 FREQUENCY BIN OUTPUT
    HY4     DATA 0      HIGH-GROUP #4 FREQUENCY BIN OUTPUT
    *
    H1N1    DATA 0      HIGH-GROUP BANDPASS FILTER DELAY #1
    H1N2    DATA 0      HIGH-GROUP BANDPASS FILTER DELAY #2
    H2N1    DATA 0      HIGH-GROUP BANDPASS FILTER DELAY #3
    H2N2    DATA 0      HIGH-GROUP BANDPASS FILTER DELAY #4
    H3N1    DATA 0      HIGH-GROUP BANDPASS FILTER DELAY #5
    H3N2    DATA 0      HIGH-GROUP BANDPASS FILTER DELAY #6
    H4N1    DATA 0      HIGH-GROUP BANDPASS FILTER DELAY #7
    H4N2    DATA 0      HIGH-GROUP BANDPASS FILTER DELAY #8
    *
    *               DTMF FREQUENCY BIN COUNTERS
    *
    F1      DATA 0      LOW-GROUP FREQUENCY COUNTER #1
    F2      DATA 0      LOW-GROUP FREQUENCY COUNTER #2
    F3      DATA 0      LOW-GROUP FREQUENCY COUNTER #3
    F4      DATA 0      LOW-GROUP FREQUENCY COUNTER #4
    F5      DATA 0      HIGH-GROUP FREQUENCY COUNTER #1
    F6      DATA 0      HIGH-GROUP FREQUENCY COUNTER #2
    F7      DATA 0      HIGH-GROUP FREQUENCY COUNTER #3
    F8      DATA 0      HIGH-GROUP FREQUENCY COUNTER #4
    *
    TESTL   DATA 0      TEST REGISTER (STORE LOW FREQUENCY)
    TESTH   DATA 0      TEST REGISTER (STORE HIGH FREQUENCY)
    *
    *               ENERGY FRAMES AND THRESHOLDS
    *
    ELY1    DATA 0      LOW-GROUP ENERGY FRAME #1
    ELY2    DATA 0      LOW-GROUP ENERGY FRAME #2
    ELY3    DATA 0      LOW-GROUP ENERGY FRAME #3
    ELY4    DATA 0      LOW-GROUP ENERGY FRAME #4
    *
    EHY1    DATA 0      HIGH-GROUP ENERGY FRAME #1
    EHY2    DATA 0      HIGH-GROUP ENERGY FRAME #2
    EHY3    DATA 0      HIGH-GROUP ENERGY FRAME #3
    EHY4    DATA 0      HIGH-GROUP ENERGY FRAME #4
    *
    LENRGY  DATA 0      LOW-GROUP NOISE ENERGY THRESHOLD
    HENRGY  DATA 0      HIGH-GROUP NOISE ENERGY THRESHOLD
    *
    PORT    DATA 0      I/O PORT
    MASK    DATA 0      DIGIT BLANKING MASK
    SEVEN   DATA 0      ARITHMETIC CONSTANT 7
    SIX     DATA 0      ARITHMETIC CONSTANT 6
    FIVE    DATA 0      ARITHMETIC CONSTANT 5
```

```
       FOUR      DATA 0           ARITHMETIC CONSTANT 4
       THREE     DATA 0           ARITHMETIC CONSTANT 3
       TWO       DATA 0           ARITHMETIC CONSTANT 2
      *
      *          TEMPORARY REGISTERS
      *
       TMPFLG    DATA 0           TEMPORARY FLAG (LARGE TWIST)
       TEMP      DATA 0           TEMPORARY REGISTER
       TEMP1     DATA 0           TEMPORARY REGISTER
      *
                 AORG 0
      *
      *****************************************************************
      *          SYSTEM RESET VECTOR                                   *
      *****************************************************************
      *
                 B START
      *

*****************************************************************
      *          SYSTEM INITIALIZATION TABLE                           *
      *****************************************************************
      *
       TABLE     DATA 1           NUMERICAL CONSTANT 1
                 DATA 0           SET ADDRESS LOGTBL TO 0
                 DATA 0           RESET PAUSE FLAG TO 0
                 DATA 0           RESET STOP FLAG TO 0
                 DATA 0           RESET GAP FLAG TO 0
                 DATA >4A00       8TH-ORDER ADAPTIVE THRESHOLD MULTIPLIER
                 DATA >4600       LOW-GROUP ADAPTIVE THRESHOLD MULTIPLIER
                 DATA >4600       HIGH-GROUP ADAPTIVE THRESHOLD MULTIPLIER
                 DATA 8           SET SIGNAL/LINE IDLE/DROPOUT DETECT
      *                           VALUE
                 DATA >400        MINIMUM SIGNAL LEVEL; SET TO -25 DB
                 DATA 0           RESET SIGNAL COUNTER TO 0
                 DATA +120        SAMPLE COUNT FOR 30 MS OF DTMF TONES
                 DATA 0           ZERO SYSTEM COUNTER VALUE
                 DATA 0           ZERO SYSTEM COUNTER VALUE
                 DATA 0           ZERO SYSTEM COUNTER VALUE
      *
                 DATA >7FFF       SET THRESHOLD FOR BANDPASS FILTERS
                 DATA >7FFF       SET THRESHOLD FOR HIGH-GROUP DTMF BINS
                 DATA >7FFF       SET THRESHOLD FOR LOW-GROUP DTMF BINS
                 DATA 0           SET LOW-GROUP ADAPTIVE THRESHOLD VALUE
                 DATA 0           SET HIGH-GROUP ADAPTIVE THRESHOLD VALUE
                 DATA +60         SET THRESHOLD COUNT FOR DTMF BINS
                 DATA 0           SET MAXIMUM OVERSPILL COUNT FOR
      *                           LOW-GROUP
                 DATA 0           SET MAXIMUM OVERSPILL COUNT FOR
      *                           HIGH-GROUP
      *
                 DATA 0           ZERO SCALED INPUT X
      *
                 DATA >330        LOW-GROUP BANDPASS FILTER INPUT SCALER
                 DATA >4A00       LOW-GROUP #1 FREQUENCY BIN OUTPUT SCALER
                 DATA >5400       LOW-GROUP #2 FREQUENCY BIN OUTPUT SCALER
                 DATA >5B00       LOW-GROUP #3 FREQUENCY BIN OUTPUT SCALER
                 DATA >6000       LOW-GROUP #4 FREQUENCY BIN OUTPUT SCALER
      *
                 DATA +14826      LOW-GROUP BANDPASS FILTER COEFFICIENT #1
                 DATA +14890      LOW-GROUP BANDPASS FILTER COEFFICIENT #1
                 DATA -31955      LOW-GROUP BANDPASS FILTER COEFFICIENT #2
                 DATA +11420      LOW-GROUP BANDPASS FILTER COEFFICIENT #3
```

```
         DATA +11360    LOW-GROUP BANDPASS FILTER COEFFICIENT #3
         DATA -31854    LOW-GROUP BANDPASS FILTER COEFFICIENT #4
    *    DATA +7432     LOW-GROUP BANDPASS FILTER COEFFICIENT #5
         DATA +7500     LOW-GROUP BANDPASS FILTER COEFFICIENT #5
         DATA -31755    LOW-GROUP BANDPASS FILTER COEFFICIENT #
    *    DATA +2981     LOW-GROUP BANDPASS FILTER COEFFICIENT #
         DATA +2950     LOW-GROUP BANDPASS FILTER COEFFICIENT #7
         DATA -31655    LOW-GROUP BANDPASS FILTER COEFFICIENT #8
    *
         DATA 0         ZERO LOW-GROUP BANDPASS FILTER OUTPUT
         DATA 0         ZERO LOW-GROUP #1 FREQUENCY BIN OUTPUT
         DATA 0         ZERO LOW-GROUP #2 FREQUENCY BIN OUTPUT
         DATA 0         ZERO LOW-GROUP #3 FREQUENCY BIN OUTPUT
         DATA 0         ZERO LOW-GROUP #4 FREQUENCY BIN OUTPUT
    *
         DATA 0         ZERO LOW-GROUP FILTER DELAY #1
         DATA 0         ZERO LOW-GROUP FILTER DELAY #2
         DATA 0         ZERO LOW-GROUP FILTER DELAY #3
         DATA 0         ZERO LOW-GROUP FILTER DELAY #4
         DATA 0         ZERO LOW-GROUP FILTER DELAY #5
         DATA 0         ZERO LOW-GROUP FILTER DELAY #6
         DATA 0         ZERO LOW-GROUP FILTER DELAY #7
         DATA 0         ZERO LOW-GROUP FILTER DELAY #8
    *
         DATA >400      HIGH-GROUP BANDPASS FILTER INPUT SCALER
         DATA >5000     HIGH-GROUP #1 FREQUENCY BIN OUTPUT
                        SCALER
         DATA >5F00     HIGH-GROUP #2 FREQUENCY BIN OUTPUT
                        SCALER
         DATA >7000     HIGH-GROUP #3 FREQUENCY BIN OUTPUT
                        SCALER
         DATA >7700     HIGH-GROUP #4 FREQUENCY BIN OUTPUT
                        SCALER
    *
    *    DATA -10368    HIGH-GROUP BANDPASS FILTER COEFFICIENT
    *                   #1
         DATA -10280    HIGH-GROUP BANDPASS FILTER COEFFICIENT
    *                   #1
         DATA -31556    HIGH-GROUP BANDPASS FILTER COEFFICIENT
    *                   #2
    *    DATA -16144    HIGH-GROUP BANDPASS FILTER COEFFICIENT
    *                   #3
         DATA -16180    HIGH-GROUP BANDPASS FILTER COEFFICIENT
    *                   #3
         DATA -31358    HIGH-GROUP BANDPASS FILTER COEFFICIENT
    *                   #4
    *    DATA -21764    HIGH-GROUP BANDPASS FILTER COEFFICIENT
    *                   #5
         DATA -21740    HIGH-GROUP BANDPASS FILTER COEFFICIENT
    *                   #5
         DATA -31162    HIGH-GROUP BANDPASS FILTER COEFFICIENT
    *                   #6
    *    DATA -26706    HIGH-GROUP BANDPASS FILTER COEFFICIENT
    *                   #7
         DATA -26700    HIGH-GROUP BANDPASS FILTER COEFFICIENT
    *                   #7
         DATA -30966    HIGH-GROUP BANDPASS FILTER COEFFICIENT
                        #8
    *
         DATA 0         ZERO HIGH-GROUP BANDPASS FILTER OUTPUT
         DATA 0         ZERO HIGH-GROUP #1 FREQUENCY BIN OUTPUT
         DATA 0         ZERO HIGH-GROUP #2 FREQUENCY BIN OUTPUT
```

```
        DATA 0      ZERO HIGH-GROUP #3 FREQUENCY BIN OUTPUT
        DATA 0      ZERO HIGH-GROUP #4 FREQUENCY BIN OUTPUT
*
        DATA 0      ZERO HIGH-GROUP FILTER DELAY #1
        DATA 0      ZERO HIGH-GROUP FILTER DELAY #2
        DATA 0      ZERO HIGH-GROUP FILTER DELAY #3
        DATA 0      ZERO HIGH-GROUP FILTER DELAY #4
        DATA 0      ZERO HIGH-GROUP FILTER DELAY #5
        DATA 0      ZERO HIGH-GROUP FILTER DELAY #6
        DATA 0      ZERO HIGH-GROUP FILTER DELAY #7
        DATA 0      ZERO HIGH-GROUP FILTER DELAY #8
*
        DATA 0      ZERO LOW-GROUP FREQUENCY COUNTER #1
        DATA 0      ZERO LOW-GROUP FREQUENCY COUNTER #2
        DATA 0      ZERO LOW-GROUP FREQUENCY COUNTER #3
        DATA 0      ZERO LOW-GROUP FREQUENCY COUNTER #4
        DATA 0      ZERO HIGH-GROUP FREQUENCY COUNTER #1
        DATA 0      ZERO HIGH-GROUP FREQUENCY COUNTER #2
        DATA 0      ZERO HIGH-GROUP FREQUENCY COUNTER #3
        DATA 0      ZERO HIGH-GROUP FREQUENCY COUNTER #4
*
        DATA 0      ZERO LOW-GROUP TEST COUNTER
        DATA 0      ZERO HIGH-GROUP TEST COUNTER
*
        DATA 0      ZERO LOW-GROUP ENERGY FRAME #1
        DATA 0      ZERO LOW-GROUP ENERGY FRAME #2
        DATA 0      ZERO LOW-GROUP ENERGY FRAME #3
        DATA 0      ZERO LOW-GROUP ENERGY FRAME #4
*
        DATA 0      ZERO HIGH-GROUP ENERGY FRAME #1
        DATA 0      ZERO HIGH-GROUP ENERGY FRAME #2
        DATA 0      ZERO HIGH-GROUP ENERGY FRAME #3
        DATA 0      ZERO HIGH-GROUP ENERGY FRAME #4
*
        DATA 0      ZERO LOW-GROUP NOISE ENERGY THRESHOLD
        DATA 0      ZERO HIGH-GROUP NOISE ENERGY THRESHOLD
*
        DATA 8      SET PORT NUMBER TO 8
        DATA >FF    SET MASK TO >FF
        DATA 7      SET SEVEN TO 7
        DATA 6      SET SIX TO 6
        DATA 5      SET FIVE TO 5
        DATA 4      SET FOUR TO 4
        DATA 3      SET THREE TO 3
        DATA 2      SET TWO TO 2
*
        DATA 0      RESET TEMPORARY FLAG TO 0
        DATA 0      ZERO TEMPORARY REGISTER
        DATA 0      ZERO TEMPORARY REGISTER
*
************************************************************
*       DTMF DIGIT DECODE TABLE                             *
************************************************************
*
NUMBER  DATA 1              1       1       1       1
        DATA 2              2       3       4       6
        DATA 3              0       3       7       3
        DATA >A             9       6       7       3
        DATA 4
        DATA 5      697     1       2       3       A
        DATA 6
        DATA >B     770     4       5       6       B
        DATA 7
```

```
           DATA 8        852       7       8       9       C
           DATA 9
           DATA >C       941       E       0       F       D
           DATA >E
           DATA 0
           DATA >F                  DTMF KEY DECODE
           DATA >D
*
****************************************************************
*          INITIALIZE SYSTEM DATA RAM AND CONSTANTS             *
****************************************************************
*
START      DINT              DISABLE ALL ILLEGAL INTERRUPTS
           LDPK 0            USE DATA PAGE 0
           LACK TABLE        LOAD POINTER TO SYSTEM PARAMETER TABLE
           LARK AR0,TEMP1    LOAD BOTTOM POINTER OF PARM. RAM TABLE
           LARK AR1,ONE      LOAND TOP POINTER OF PARM. RAM TABLE
INITC      LARP AR1          POINT AT TOP OF PARM. RAM TABLE
           TBLR *+           INITIALIZE SYSTEM PARAMETERS
           ADD  ONE          INCREMENT TABLE POINTER
           LARP AR0          CHOOSE BOTTOM POINTER
           BANZ INITC        TEST IF INITIALIZATION DONE
           LT   ONE          FETCH CODEC CONVERSION TABLE ADDRESS
           MPYK CODADD       PUT IT IN THE P-REGISTER
           PAC               PUT IT IN THE ACCUMULATOR
           SACL LOGTBL       STORE IT IN LOCATION LOGTBL
*
****************************************************************
*          INITIALIZE SYSTEM HEX DIGIT DISPLAYS                 *
****************************************************************
*
           LAC  MASK,8
           SACL TEMP
           OUT  TEMP,0       CLEAR DISPLAY
*
****************************************************************
*          INITIALIZE DTMF FLAGS AND COUNTERS                   *
****************************************************************
*
DTMF       ZAC
           SACL SIGCNT       RESET FLAGS AND COUNTERS
           SACL STOP
           SACL GAP
           SACL PAUSE
           SACL F1           RESET FREQUENCY BIN OUTPUTS
           SACL F2
           SACL F3
           SACL F4
           SACL F5
           SACL F6
           SACL F7
           SACL F8
           SACL CNTR         RESET TEMPORARY COUNTERS
           SACL CNTR1
           SACL CNTR2
*
****************************************************************
*          INITIALIZE ADAPTIVE ENERGY FRAMES                    *
****************************************************************
*
           SACL ELY1         RESET ENERGY FRAMES
           SACL ELY2
```

```
                    SACL ELY3
                    SACL ELY4
                    SACL EHY1
10                  SACL EHY2
                    SACL EHY3
                    SACL EHY4
                    SACL LENRGY    RESET FRAME ENERGY REGISTERS
                    SACL HENRGY
15  *
    ****************************************************************
    *           INITIALIZE ADAPTIVE THRESHOLDS                     *
    ****************************************************************
    *
20                  SACL ADJL      RESET DATA ADAPTIVE THRESHOLDS
                    SACL ADJH
    *
    ****************************************************************
    *           CODEC INPUT BIO WAIT LOOP                          *
25  ****************************************************************
    *
    SYNC            BIOZ SYNC1     WAIT FOR INPUT SAMPLE
                    B    SYNC
    SYNC1           IN   X,0       PERFORM 4 KHZ SUB-SAMPLING
30  SYNC2           BIOZ INPUT     AND ALIAS INPUT SPECTRUM
                    B    SYNC2
    INPUT           CALL CODEC     CALL PCM-TO-LINEAR ROUTINE
    *
    ****************************************************************
35  *           DTMF TONE DETECTION AND ASSOCIATED PROCESSING      *
    ****************************************************************
    *
    DETECT          CALL HILOW     CALL HIGH-GROUP AND LOW-GROUP FILTERS
    *
40                  ZALS PAUSE     CHECKING INTER-DIGIT PAUSE?
                    BNZ  GAP1
    *
                    ZALS GAP       HAS 40 MS DTMF TRANSMISSION ELAPSED?
                    BNZ  T8
45  *
    *               TRACK INPUT SIGNAL ENERGY FOR HIGH AND LOW GROUPS
    *
    EFRM1           LAC  LY,11     SAVE LOW-GROUP ENERGY INFORMATION
                    ABS
                    ADDH LENRGY
                    SACH LENRGY
 5  EFRM2           LAC  HY,11     SAVE HIGH-GROUP ENERGY INFORMATION
                    ABS
                    ADDH HENRGY
                    SACH HENRGY
    *
10  *               TRACK INPUT SIGNAL SWING/PEAK INFORMATION PROCESSING
    *
                    LAC  LY        SAVE LOW-GROUP PEAK INFORMATION
                    ABS
                    SACL TEMP
15                  SUB  ADJL
                    BLEZ PK
                    LAC  TEMP
                    SACL ADJL
    PK              LAC  HY        SAVE HIGH-GROUP PEAK INFORMATION
20                  ABS
                    SACL TEMP
                    SUB  ADJH
```

```
               BLEZ PK1
               LAC  TEMP
               SACL ADJH
         PK1   ZALS CNTR1
               ADD  ONE
               SACL CNTR1
               SUB  MINCNT    SAVE PEAKS OVER MINCNT SAMPLES
               BLZ  T8
               ZAC
               SACL CNTR1
      *
      *        FRAME ENERGY PROCESSING FOR FIRST 40MS DURATION
      *
               ZALS CNTR2
               ADD  ONE
               SACL CNTR2
         FRM1  LACK 5         DECREMENT COUNTS FOR FIRST FRAME
               SUB  CNTR2     (10MS, 5 PERIODS OF 8 SAMPLES EACH)
               BNZ  FRM2
               LACK 1
               SACL STOP
               LAC  LENRGY
               SACL ELY1
               LAC  HENRGY
               SACL EHY1
               B    ZEROE
         FRM2  LACK 10        DECREMENT COUNTS FOR SECOND FRAME
               SUB  CNTR2     (10MS, 5 PERIODS OF 8 SAMPLES EACH)
               BNZ  FRM3
               LAC  LENRGY
               SACL ELY2
               LAC  HENRGY
               SACL EHY2
               B    ZEROE
         FRM3  LACK 15        DECREMENT COUNTS FOR THIRD FRAME
               SUB  CNTR2     (10MS, 5 PERIODS OF 8 SAMPLES EACH)
               BNZ  FRM4
               LAC  LENRGY
               SACL ELY3
               LAC  HENRGY
               SACL EHY3
               B    ZEROE
         FRM4  LACK 20        DECREMENT COUNTS FOR FOURTH FRAME
               SUB  CNTR2     (10MS, 5 PERIODS OF 8 SAMPLES EACH)
               BNZ  TSTW
               LAC  LENRGY
               SACL ELY4
               LAC  HENRGY
               SACL EHY4
         ZEROE ZAC
               SACL LENRGY
               SACL HENRGY
      *
      *        TWIST TEST (+4.0 DB TO -8.0 DB)
      *
         TSTW  LAC  ADJL      TEST FOR TWIST BEFORE
               SUB  ADJH      CALCULATING NEW THRESHOLDS
               BGEZ TSTW1     IS LOW PEAK >= HIGH PEAK
               LAC  ADJL
               SACL TEMP      SAVE SMALLER VALUE FOR ADAPT. THRESHOLD
               LT   ADJH      20 LOG (H/Y) = +4DB --> H*0.631 = L
               MPYK >900
               PAC
```

```
40              SUB   ADJL,12
                BGEZ  DTMF
                B     ADJST
        TSTW1   LAC   ADJH
                SACL  TEMP        SAVE SMALLER VALUE FOR ADAPT. THRESHOLD
45              LT    ADJL        20 LOG(H/Y) = -4DB --> L*0.631 = H
                MPYK  >680
                PAC
                SUB   ADJH,12
                BGEZ  TSTW2
                LACK  >46
5               SACL  TEMP1
                LAC   TEMP1,8
                SACL  THRADH
                ZAC
                SACL  TMPFLG
10              B     ADJST
        TSTW2   LACK  >60
                SACL  TEMP1
                LAC   TEMP1,8
                SACL  THRADH
15              LACK  1
                SACL  TMPFLG
                MPYK  >4E0
                PAC
                SUB   ADJH,12
20              BGEZ  DTMF
        *
        *
        *       TEST FOR MINIMUM INPUT SIGNAL LEVEL (APPROX: -25 DB)
        *
        ADJST   LAC   ADJH        TEST FOR MINIMUM SIGNAL
25              SUB   MINTHR
                BLEZ  DTMF
                LAC   ADJL
                SUB   MINTHR
                BLEZ  DTMF
30      *
        *
        *       CALCULATE DATA-ADAPTIVE THRESHOLDS FOR TONES
        *
        CALTHR  LT    TEMP        CALCULATE NEW THRESHOLD FOR
                MPY   THRADJ      HIGH-GROUP AND LOW-GROUP
35              PAC               EIGHT-ORDER BANDSPLIT FILTERS
                SACH  THRSH8
                LT    ADJH        CALCULATE NEW THRESHOLD FOR
                MPY   THRADH      HIGH-GROUP FREQUENCY BINS
                PAC
40              SACH  THRHI
                LT    ADJL        CALCULATE NEW THRESHOLD FOR
                MPY   THRADL      LOW-GROUP FREQUENCY BINS
                PAC
                SACH  THRLO
45      *
        *       CHECK FOR TONE PRESENCE IN LOW-GROUP
        T8      LAC   LY          GET LOW RESULT
                ABS               MAKE POSITIVE
                SUB   THRSH8      APPLY THRESHOLD
                BLEZ  THR
5       *
        *       CHECK FOR TONE PRESENCE IN HIGH-GROUP
        *
                LAC   HY          GET HIGH RESULT
                ABS               MAKE POSITIVE
```

```
                SUB   THRSH8      APPLY THRESHOLD
                BLEZ  THR
        *
                ZAC
                SACL  CNTR        ZERO TEMP CNTR AND GO TO
                B     SECOND      THRESHOLD FREQUENCY BINS
        *
        *       CHECK FOR END OF DTMF TRANSMISSION
        *
        THR     ZALS  CNTR        CHECK IF INPUT SIGNAL IS GONE FOR
                ADD   ONE         MINCNT CONSECUTIVE INPUT SAMPLES
                SACL  CNTR
                SUB   MINCNT
                BLZ   TCNT
        *
                ZALS  GAP         HAS 40MS DTMF TRANSMISSION ELAPSED?
                BZ    DTMF        IF YES, TRACK FOR INTER-DIGIT PAUSE
        *
        *       CHECK FOR VALID INTER-DIGIT PAUSE
        *
        GAPCHK  LACK  1
                SACL  PAUSE
                LACK  >88
                SACL  SIGCNT
        GAP1    ZALS  SIGCNT
                SUB   ONE
                SACL  SIGCNT
                BGZ   SYNC
                LACK  >10         BLANK DISPLAY
                SACL  >7F         NOTE: DATA RAM LOCATION >7F IS USED
        *       OUT   >7F,3       OUTPUT BLANKING SIGNAL TO PORT 3
        *
        HOME    B     DTMF        RESET SYSTEM
        *
        *       THRESHOLD DTMF FREQUENCY BIN OUTPUTS
        *
        SECOND  ZALS  GAP

BNZ   SYNC
                ZALS  STOP
                BZ    TCNT
        THR0    LAC   LY1         THRESHOLD LOW-GROUP FREQUENCY BIN #1
                ABS
                SUB   THRLO
                BLEZ  THR1
                ZALS  F1          UPDATE LOW-GROUP FREQUENCY COUNTER #1
                ADD   ONE
                SACL  F1
        THR1    LAC   LY2         THRESHOLD LOW-GROUP FREQUENCY BIN #2
                ABS
                SUB   THRLO
                BLEZ  THR2
                ZALS  F2          UPDATE LOW-GROUP FREQUENCY COUNTER #2
                ADD   ONE
                SACL  F2
        THR2    LAC   LY3         THRESHOLD LOW-GROUP FREQUENCY BIN #3
                ABS
                SUB   THRLO
                BLEZ  THR3
                ZALS  F3          UPDATE LOW-GROUP FREQUENCY COUNTER #3
                ADD   ONE
                SACL  F3
```

```
THR3    LAC  LY4       THRESHOLD LOW-GROUP FREQUENCY BIN #4
        ABS
        SUB  THRLO
        BLEZ THR4
        ZALS F4        UPDATE LOW-GROUP FREQUENCY COUNTER #4
        ADD  ONE
        SACL F4
THR4    LAC  HY1       THRESHOLD HIGH-GROUP FREQUENCY BIN #1
        ABS
        SUB  THRHI
        BLEZ THR5
        ZALS F5        UPDATE HIGH-GROUP FREQUENCY COUNTER #1
        ADD  ONE
        SACL F5
THR5    LAC  HY2       THRESHOLD HIGH-GROUP FREQUENCY BIN #2
        ABS
        SUB  THRHI
        BLEZ THR6
        ZALS F6        UPDATE HIGH-GROUP FREQUENCY COUNTER #2
        ADD  ONE
        SACL F6
THR6    LAC  HY3       THRESHOLD HIGH-GROUP FREQUENCY BIN #3
        ABS
        SUB  THRHI
        BLEZ THR7
        ZALS F7        UPDATE HIGH-GROUP FREQUENCY COUNTER #3
        ADD  ONE
        SACL F7
THR7    LAC  HY4       THRESHOLD HIGH-GROUP FREQUENCY BIN #4
        ABS
        SUB  THRHI
        BLEZ TCNT
        ZALS F8        UPDATE HIGH-GROUP FREQUENCY COUNTER #4
        ADD  ONE
        SACL F8
*
TCNT    ZALS GAP       CHECK TOTAL SAMPLE COUNT
        BNZ  SYNC
        ZALS STOP      CHECK TOTAL SAMPLE COUNT
        BZ   SYNC
        ZALS SIGCNT    INCREMENT COUNT
        ADD  ONE
        SACL SIGCNT
*
        SUB  SCNT      TEST FOR 40MS TIME UP
        BLEZ SYNC
*
****************************************************************
*            DTMF DIGIT DECODER                                 *
****************************************************************
*       LOW-GROUP TONE DECODE
*
DECODE  EQU  $
*
*       ADAPTIVE PROFILE CHECK FOR 697 HZ BIN
*
FIO     LARP 0
        LARK 0,0
        LARK 1,0
        ZALS F1        DECODE LOW-GROUP FREQUENCY BIN #1
        SACL TESTL
        SUB  THRHL
```

```
         BLEZ FI1         TONE ABSENT, TRY NEXT BIN
EPCHK0   LT   ELY1        FIRST PROFILE CHECK
*        MPYK 3891        0.95*4096 (DEMO VERSION)
         MPYK 4095        0.999*4096
         PAC
         SUB  ELY2,12
         BGEZ NOFIND      REJECT IF PATTERN FAILS
         LT   ELY2        SECOND PROFILE CHECK
*        MPYK 3686        0.90*4096 (DEMO VERSION)
         MPYK 4095        0.999*4096
         PAC
         SUB  ELY3,12
         BGEZ NOFIND      REJECT IF PATTERN FAILS
EXIT0    SAR  1,F1        TONE PRESENT, ZERO COUNT FOR NOISE CHECK
         SAR  1,CNTR1     ZERO TONE PURITY COUNT FOR NOISE CHECK
         B    FIND1
*
*        ADAPTIVE PROFILE CHECK FOR 770 HZ BIN
*
FI1      MAR  *+
         ZALS F2          DECODE LOW-GROUP FREQUENCY BIN #2
         SACL TESTL
         SUB  THRHL
         BLEZ FI2         TONE ABSENT, TRY NEXT BIN
EPCHK1   LT   ELY1        FIRST PROFILE CHECK
*        MPYK 3891        0.95*4096 (DEMO VERSION)
         MPYK 4095        0.999*4096
         PAC
         SUB  ELY2,12
         BGEZ NOFIND      REJECT IF PATTERN FAILS
         LT   ELY2        SECOND PROFILE CHECK
*        MPYK 3686        0.90*40.96 (DEMO VERSION)
         MPYK 4094        0.999*4096
         PAC
         SUB  ELY3,12
         BGEZ NOFIND      REJECT IF PATTERN FAILS
EXIT1    SAR  1,F2        TONE PRESENT, ZERO COUNT FOR NOISE CHECK
         SAR  1,CNTR1     ZERO TONE PURITY COUNT FOR NOICE CHECK
         B    FIND1
*
*        ADAPTIVE PROFILE CHECK FOR 852 HZ BIND
*
FI2      MAR  *+
         ZALS F3          DECODE LOW-GROUP FREQUENCY BIN #3
         SACL TESTL
         SUB  THRHL
         BLEZ FI3         TONE ABSENT, TRY NEXT BIN
EPCHK2   LT   ELY1        FIRST PROFILE CHECK
*        MPYK 3891        0.95*4096 (DEMO VERSION)
         MPYK 4095        0.999*4096
         PAC
         SUB  ELY2,12
         BGEZ NOFIND      REJECT IF PATTERN FAILS
         LT   ELY2        SECOND PROFILE CHECK
*        MPYK 3686        0.90*4096 (DEMO VERSION)
         MPYK 3840        0.937*4096
         PAC
         SUB  ELY3,12
         BGEZ NOFIND      REJECT IF PATTERN FAILS
EXIT2    SAR  1,F3        TONE PRESENT, ZERO COUNT FOR NOISE CHECK
         SAR  1,CNTR1     ZERO TONE PURITY COUNT FOR NOISE CHECK
         B    FIND1
*
```

```
*       ADAPTIVE PROFILE CHECK FOR 941 HZ BIN
*
FI3     MAR   *+
        ZALS  F4           DECODE LOW-GROUP FREQUENCY BIN #4
        SACL  TESTL
        SUB   THRHL
        BLEZ  NOFIND       TONE ABSENT, ABORT DTMF DECODE
EPCHK3  LT    ELY1         FIRST PROFILE CHECK
*       MPYK  3891         0.95*4096 (DEMO VERSION)
        MPYK  4048         0.988*4096
        PAC
        SUB   ELY2,12
        BGEZ  NOFIND       REJECT IF PATTERN FAILS
        LT    ELY2         SECOND PROFILE CHECK
*       MPYK  3686         0.90*4096 (DEMO VERSION)
        MPYK  3712         0.906*4096
        PAC
        SUB   ELY3,12
        BGEZ  NOFIND       REJECT IF PATTERN FAILS
EXIT3   SAR   1,F4         TONE PRESENT, ZERO COUNT FOR NOISE CHECK
        SAR   1,CNTR1      ZERO TONE PURITY COUNT FOR NOISE CHECK
*
*       CALCULATE ADAPTIVE NOISE FLOOR/ENERGY FOR LOW-GROUP
*
FIND1   LACK  63           CHECK IF TONE COUNT < 63
        SUB   TESTL
        BLEZ  CAL11
        LACK  2            SET MAX. NOISE FLOOR AND ENERGY TO 2
        SACL  LOLIM
        SACL  LENRGY
        B     FIND11
CAL11   LACK  65           CHECK IF TONE COUNT < 65
        SUB   TESTL
        BLEZ  CAL12
        LACK  3            SET MAX. NOISE FLOOR VALUE TO 3
        SACL  LOLIM
        ADD   ONE,0        SET MAX. NOISE ENERGY TO 4
        SACL  LENRGY
        B     FIND11
CAL12   LACK  68           CHECK IF TONE COUNT < 68
        SUB   TESTL
        BLEZ  CAL13
        LACK  5            SET MAX. NOISE FLOOR VALUE TO 5
        SACL  LOLIM
        ADD   ONE,1        SET MAX. NOISE ENERGY TO 7
        SACL  LENERGY
        B     FIND11
CAL13   LACK  73           CHECK IF TONE COUNT < 73
        SUB   TESTL
        BLEZ  CAL14
        LACK  7            SET MAX. NOISE FLOOR VALUE TO 7
        SACL  LOLIM
        ADD   ONE,1        SET MAX. NOISE ENERGY TO 9
        SACL  LENRGY
        B     FIND11
CAL14   LACK  78           CHECK IF TONE COUNT <78
        SUB   TESTL
        BLEZ  CAL15
        LACK  9            SET MAX. NOISE FLOOR VALUE TO 9
        SACL  LOLIM
        ADD   ONE,2        SET MAX. NOISE ENERGY TO 13
        SACL  LENRGY
        B     FIND11
```

```
CAL15     LACK  14         SET MAX. NOISE FLOOR VALUE TO 14 FOR A
          SACL  LOLIM      TONE COUNT GREATER THAN OR EQUAL TO 78
          ADD   ONE,0      SET MAX. NOISE ENERGY TO 15
          SACL  LENRGY
*
*         CHECK FOR PRESENCE OF ONLY ONE TONE IN LOW-GROUP
*
FIND11    SAR   0,TEMP
          ZALS  F1
          SUB   LOLIM
          BGZ   NOFIND     REJECT IF SIGNAL > NOISE FLOOR
          ZALS  F2
          SUB   LOLIM
          BGZ   NOFIND     REJECT IF SIGNAL > NOISE FLOOR
          ZALS  F3
          SUB   LOLIM
          BGZ   NOFIND     REJECT IF SIGNAL > NOISE FLOOR
          ZALS  F4
          SUB   LOLIM
          BGZ   NOFIND     REJECT IF SIGNAL > NOISE FLOOR
*
*         TONE PURITY CHECK : ZERO COUNT FOR AT LEAST TWO BINS
*
TP0       ZALS  F1         CHECK IF F1 BIN COUNT IS ZERO
          BNZ   TP1
          ZALS  CNTR1      INCREMENT TONE PURITY COUNTER IF YES
          ADD   ONE
          SACL  CNTR1
TP1       ZALS  F2         CHECK IF F2 BIN COUNT IS ZERO
          BNZ   TP2
          ZALS  CNTR1      INCREMENT TONE PURITY COUNTER IF YES
          ADD   ONE
          SACL  CNTR1
TP2       ZALS  F3         CHECK IF F3 BIN COUNT IS ZERO
          BNZ   TP3
          ZALS  CNTR1      INCREMENT TONE PURITY COUNTER IF YES
          ADD   ONE
          SACL  CNTR1
TP3       ZALS  F4         CHECK IF F4 BIN COUNT IS ZERO
          BNZ   TPCHK1
          ZALS  CNTR1      INCREMENT TONE PURITY COUNTER IF YES
          ADD   ONE
          SACL  CNTR1
TPCHK1    LACK  3          CHECK IF AT LEAST 2 BINS HAVE 0 COUNT
          SUB   CNTR1
          BLEZ  F14        IF NOT, CHECK NOISE ENERGY
*
*         LOW-GROUP ADAPTIVE NOISE ENERGY CHECK
*
NECHK1    ZALS  F1         SUM ALL NOISE ENERGY
          ADDS  F2
          ADDS  F3
          ADDS  F4
          SUBS  LENRGY
          BGZ   NOFIND     REJECT IF TOO MUCH NOISE ENERGY
*
*         HIGH-GROUP TONE DECODE
*
NXTGRP    EQU   $
*
```

```
*          ADAPTIVE PROFILE CHECK FOR 1209 HZ BIN
*
FI4        LARK  0,0
           ZALS  F5            DECODE HIGH-GROUP FREQUENCY BIN #1
           SACL  TESTH
           SUB   THRHL
           BLEZ  FI5           TONE ABSENT, TRY NEXT BIND
EPCHK4     LT    EHY1          FIRST PROFILE CHECK
*          MPYK  3686          0.90*4096 (DEMO VERSION)
           MPYK  4095          0.999*4096
           PAC
           SUB   EHY2,12
           BGEZ  NOFIND        REJECT IF PATTERN FAILS
           LAC   TMPFLG
           BNZ   EXIT4
           LT    EHY2          SECOND PROFILE CHECK
*          MPYK  3276          0.80*4096 (DEMO VERSION)
           MPYK  3276          0.800*4096
           PAC
           SUB   EHY3,12
           BGEZ  NOFIND        REJECT IF PATTERN FAILS
EXIT4      SAR   1,F5          TONE PRESENT, ZERO COUNT FOR NOISE CHECK
           SAR   1,CNTR2       ZERO TONE PURITY COUNT FOR NOISE CHECK
           B     FIND2
*
*          ADAPTIVE PROFILE CHECK FOR 1336 HZ BIN
*
FI5        MAR   *+
           ZALS  F6            DECODE HIGH-GROUP FREQUENCY BIN #2
           SACL  TESTH
           SUB   THRHL
           BLEZ  FI6           TONE ABSENT, TRY NEXT BIN
EPCHK5     LT    EHY1          FIRST PROFILE CHECK
*          MPYK  3686          0.90*4096 (DEMO VERSION)
           MPYK  3350          0.844*4096
           PAC
           SUB   EHY2,12
           BGEZ  NOFIND        REJECT IF PATTERN FAILS
           LAC   TMPFLG
           BNZ   EXIT5
           LT    EHY2          SECOND PROFILE CHECK
*          MPYK  3276          0.80*4096 (DEMO VERSION)
           MPYK  3460          0.844*4096
           PAC
           SUB   EHY3,12
           BGEZ  NOFIND        REJECT IF PATTERN FAILS
EXIT5      SAR   1,F6          TONE PRESENT, ZERO COUNT FOR NOISE CHECK
           SAR   1,CNTR2       ZERO TONE PURITY COUNT FOR NOISE CHECK
           B     FIND2
*
*          ADAPTIVE PROFILE CHECK FOR 1477 HZ BIN
*
FI6        MAR   *+
           ZALS  F7            DECODE HIGH-GROUP FREQUENCY BIN #3
           SACL  TESTH
           SUB   THRHL
           BLEZ  FI7           TONE ABSENT, TRY NEXT BIN
EPCHK6     LT    EHY1          FIRST PROFILE CHECK
*          MPYK  3686          0.90*4096 (DEMO VERSION)
           MPYK  3840          0.937*4096
           PAC
           SUB   EHY2,12
```

```
              BGEZ NOFIND      REJECT IF PATTERN FAILS
              LAC  TMPFLG
15            BNZ  EXIT6
              LT   EHY2        SECOND PROFILE CHECK
     *        MPYK 3276        0.80*4096 (DEMO VERSION)
              MPYK 3328        0.812*4096
              PAC
20            SUB  EHY3,12
              BGEZ NOFIND      REJECT IF PATTERN FAILS
     EXIT6    SAR  1,F7        TONE PRESENT, ZERO COUNT FOR NOISE CHECK
              SAR  1,CNTR2     ZERO TONE PURITY COUNT FOR NOISE CHECK
              B    FIND2
25   *
     *        ADAPTIVE PROFILE CHECK FOR 1633 HZ BIN
     *
     FI7      MAR  *+
              ZALS F8          DECODE HIGH-GROUP FREQUENCY BIN #4
30            SACL TESTH
              SUB  THRHL
              BLEZ NOFIND      TONE ABSENT, ABORT DTMF DECODE
     EPCHK7   LT   EHY1        FIRST PROFILE CHECK
     *        MPYK 3686        0.90*4096 (DEMO VERSION)
35            MPYK 3840        0.937*4096
              PAC
              SUB  EHY2,12
              BGEZ NOFIND      REJECT IF PATTERN FAILS
              LAC  TMPFLG
40            BNZ  EXIT7
              LT   EHY2        SECOND PROFILE CHECK
     *        MPYK 3276        0.80*4096 (DEMO VERSION)
              MPYK 3328        0.844*4096
              PAC
45            SUB  EHY3,12
              BGEZ NOFIND      REJECT IF PATTERN FAILS
     EXIT7    SAR  1,F8        TONE PRESENT, ZERO COUNT FOR NOISE CHECK
              SAR  1,CNTR2     ZERO TONE PURITY COUNT FOR NOISE CHECK
     *
     *        CALCULATE ADAPTIVE NOISE FLOOR/ENERGY FOR HIGH-GROUP
5    *
     FIND2    LACK 63          CHECK IF TONE COUNT < 63
              SUB  TESTH
              BLEZ CAL21
              LACK 2           SET MAX. NOISE FLOOR AND ENERGY TO 2
10            SACL HILIM
              SACL HENRGY
              B    FIND22
     CAL21    LACK 65          CHECK IF TONE COUNT < 65
              SUB  TESTH
15            BLEZ CAL22
              LACK 2           SET MAX. NOISE FLOOR VALUE TO 2
              SACL HILIM
              ADD  ONE,0       SET MAX. NOISE ENERGY TO 3
              SACL HENRGY
20            B    FIND22
     CAL22    LACK 68          CHECK IF TONE COUNT < 68
              SUB  TESTH
              BLEZ CAL23
              LACK 3           SET MAX. NOISE FLOOR VALUE TO 3
25            SACL HILIM
              ADD  ONE,1       SET MAX. NOISE ENERGY TO 5
              SACL HENRGY
              B    FIND22
```

```
       CAL23      LACK  73         CHECK IF TONE COUNT < 73
30                SUB   TESTH
                  BLEZ  CAL24
                  LACK  5          SET MAX. NOISE FLOOR VALUE TO 5
                  SACL  HILIM
                  ADD   ONE,1      SET MAX. NOISE ENERGY TO 7
35                SACL  HENRGY
                  B     FIND22
       CAL24      LACK  78         CHECK IF TONE COUNT < 78
                  SUB   TESTH
                  BLEZ  CAL25
40                LACK  6          SET MAX. NOISE FLOOR VALUE TO 6
                  SACL  HILIM
                  ADD   ONE,1      SET MAX. NOISE ENERGY TO 8
                  SACL  HENRGY
                  B     FIND22
45     CAL25      LACK  15         SET MAX. NOISE FLOOR VALUE TO 15 FOR A
                  SACL  HILIM      TONE COUNT GREATER THAN OR EQUAL TO 78
                  ADD   ONE,0      SET MAX. NOISE ENERGY TO 16
                  SACL  HENRGY
       *
       *          CHECK FOR PRESENCE OF ONLY ONE TONE IN HIGH-GROUP
 5     *
       FIND22     ZALS  F5
                  SUB   HILIM
                  BGZ   NOFIND     REJECT IF SIGNAL > NOISE FLOOR
                  ZALS  F6
10                SUB   HILIM
                  BGZ   NOFIND     REJECT IF SIGNAL > NOISE FLOOR
                  ZALS  F7
                  SUB   HILIM
                  BGZ   NOFIND     REJECT IF SIGNAL > NOISE FLOOR
15                ZALS  F8
                  SUB   HILIM
                  BGZ   NOFIND     REJECT IF SIGNAL > NOISE FLOOR
       *
       *          TONE PURITY CHECK : ZERO COUNT FOR AT LEAST TWO BINS
20     *
       TP4        ZALS  F5         CHECK IF F5 BIN COUNT IS ZERO
                  BNZ   TP5
                  ZALS  CNTR2      INCREMENT TONE PURITY COUNTER IF YES
                  ADD   ONE
25                SACL  CNTR2
       TP5        ZALS  F6         CHECK IF F6 BIN COUNT IS ZERO
                  BNZ   TP6
                  ZALS  CNTR2      INCREMENT TONE PURITY COUNTER IF YES
                  ADD   ONE
30                SACL  CNTR2
       TP6        ZALS  F7         CHECK IF F7 BIN COUNT IS ZERO
                  BNZ   TP7
                  ZALS  CNTR2      INCREMENT TONE PURITY COUNTER IF YES
                  ADD   ONE
35                SACL  CNTR2
       TP7        ZALS  F8         CHECK IF F8 BIN COUNT IS ZERO
                  BNZ   TPCHK2
                  ZALS  CNTR2      INCREMENT TONE PURITY COUNTER IS YES
                  ADD   ONE
40                SACL  CNTR2
       TPCHK2     LACK  3          CHECK IF AT LEAST 2 BINS HAVE 0 COUNT
                  SUB   CNTR2
                  BLEZ  HDIGIT     IF NOT, CHECK NOISE ENERGY
       *
```

```
*              HIGH-GROUP ADAPTIVE NOISE ENERGY CHECK
*
NECHK2    ZALS F5          SUM ALL NOISE ENERGY
          ADDS F6
          ADDS F7
          ADDS F8
          SUBS HENRGY
          BGZ  NOFIND      REJECT IF TOO MUCH ENERGY
*
***************************************************************
*              END OF DECODER ROUTINE                          *
***************************************************************
*
*              LOOKUP DECODED HEX DIGIT FROM HEX TABLE
*
HDIGIT    LACK NUMBER      CODE DUAL TONE IN HEX DIGIT.
          ADD  TEMP,2
          SAR  0,TEMP
          ADD  TEMP
          TBLR TEMP        VALID HEX DIGIT IS IN TEMP
*
*              DIGIT COUNTS
*
DCOUNT    SACL TEMP1
          LACK NUMBER
          SUB  TEMP1
          BZ   DIGIT1
          LACK NUMBER+3
          SUB  TEMP1
          BZ   NDIGIT
          LACK NUMBER+7
          SUB  TEMP1
          BZ   NDIGIT
          LACK NUMBER+11
          SUB  TEMP1
          BZ   NDIGIT
          LACK NUMBER+15
          SUB  TEMP1
          BZ   NDIGIT
          LACK NUMBER+12
          SUB  TEMP1
          BZ   STARLB
          LACK NUMBER+14
          SUB  TEMP1
          BZ   STARLB
          B    JBEDIT
DIGIT1    ZALS >7A
          ADD  ONE
          SACL >7A
          B    JBEDIT
NDIGIT    ZALS >7B
          ADD  ONE
          SACL >7B
          B    JBEDIT
STARLB    ZALS >7C
          ADD  ONE
          SACL >7C
*
***************************************************************
*              OUTPUT DECODED HEX DIGIT                        *
***************************************************************
*
```

```
JBEDIT    LAC   MASK,7    SHIFT MASK LEFT ONE SPACE TO UNBLANK
          SACL  MASK      NEXT DIGIT
          LAC   MASK,8
          SACH  MASK
          LAC   PORT      POINT TO NEXT DIGIT
          SUB   ONE
          SACL  PORT
          BGEZ  OK        IF PORT IS LESS THAN ZERO TIME TO RESET
          LACK  7         BLANKING. MASK AND DIGIT POINTER (PORT)
          SACL  PORT
          LACK  >7F
          SACL  MASK
OK        LAC   MASK,8    OTHERWISE FORM OUTPUT WORD AND DISPLAY
*
****************************************************************
*
*         +----------------------------------------------+
*                                              DISPLAY
*         -BLANKING REGISTER-      X X X X    --DATA--
*         -  -  -  -  -  -  -  -   -  -  -  -  -  -  -
*         15 14 13 12 11 10 9  8   7 6 5 4    3  2 1 0
*
*                OUTPUT WORD (TEMP) FORMAT
*         +----------------------------------------------+
*
****************************************************************
*
          ADD   TEMP
          SACL  TEMP1
          LAC   PORT      WRITE OUTPUT WORD TO DISPLAY CIRCUIT
          SUB   SEVEN
          BZ    SEVENJ
          LAC   PORT      WRIT OUTPUT WORD TO DISPLAY CIRCUIT
          SUB   SIX
          BZ    SIXJ
          LAC   PORT      WRITE OUTPUT WORD TO DISPLAY CIRCUIT
          SUB   FIVE
          BZ    FIVEJ
          LAC   PORT      WRITE OUTPUT WORD TO DISPLAY CIRCUIT
          SUB   FOUR
          BZ    FOURJ
          LAC   PORT      WRITE OUTPUT WORD TO DISPLAY CIRCUIT
          SUB   THREE
          BZ    THREEJ
          LAC   PORT      WRITE OUTPUT WORD TO DISPLAY CIRCUIT
          SUB   TWO
          BZ    TWOJ
          LAC   PORT      WRITE OUTPUT TO DISPLAY CIRCUIT
          SUB   ONE
          BZ    ONEJ
*
ZEROJ     OUT   TEMP1,0
          B     JBCON
ONEJ      OUT   TEMP1,1
          B     JBCON
TWOJ      OUT   TEMP1,2
          B     JBCON
THREEJ    OUT   TEMP1,3
          B     JBCON
FOURJ     OUT   TEMP1,4
          B     JBCON
```

```
FIVEJ     OUT  TEMP1,5
SIXJ      OUT  TEMP1,6
          B    JBCON
SEVENJ    OUT  TEMP1,7
*
******************************************************************
*              END OF DIGIT OUTPUT ROUTINE                        *
******************************************************************
*
*
*         UPDATE COUNTER FOR VALIDATED DIGITS
*
JBCON     ZALS >7E         UPDATE COUNTER OF VALID DECODES
          ADD  ONE
          SACL >7E         NOTE: DATA RAM LOCATION > 7E IS USED
*
SETGAP    LACK 1           VALID INTER-DIGIT PAUSE MUST
          SACL GAP         FOLLOW DTMF TONE - SET GAP FLAG
          B    SYNC
*
*         UPDATE COUNTER TO INDICATE NUMBER OF REJECTIONS
*
NOFIND    ZALS >7D         UPDATE COUNTER OF REJECTED DIGITS DUE
          ADD  ONE         TO DIGIT SIMULATIONS OR OTHERWISE
          SACL >7D         NOTE: DATA RAM LOCATION >7D IS USED
*
          B    SETGAP      CONTINUE
*
******************************************************************
*              LOW-GROUP/HIGH-GROUP BANDPASS FILTERS              *
******************************************************************
*
HILOW     ZAC
          LT   TEMP        LOAN LINEAR PCM DATA
          MPY  LS          SCALE INPUT DATA
          LTA  LIN2        LOAD RESULT INTO THE ACCUMULATOR
          SACH X,1         STORE IN LOCATION X
*
*         DTMF LOW-GROUP BANDPASS FILTER
*
          LAC  X,15
          MPY  L1D
          LTD  L1N1
          MPY  L1C
          APAC
          SACH LY1,1
          LTA  LY1
          SACH L1N1,1
          MPY  LS1
          PAC
          LTA  L2N2
          SACH LY1,1
*
          LAC  X,15
          MPY  L2D
          LTD  L2N1
          MPY  L2C
          APAC
          SACH LY2,1
          LTA  LY2
          SACH L2N1,1
```

```
45      MPY   LS2
        PAC
        LTA   L3N2
        SACH  LY2,1
   *
        LAC   X,15
 5      MPY   L3D
        LTD   L3N1
        MPY   L3C
        APAC
        SACH  LY3,1
10      LTA   LY3

SACH  L3N1,1
        MPY   LS3
        PAC
15      LTA   L4N2
        SACH  LY3,1
   *
        LAC   X,15
        MPY   L4D
20      LTD   L4N1
        MPY   L4C
        APAC
        SACH  LY4,1
        LTA   LY4
25      SACH  L4N1,1
        MPY   LS4
        PAC
        LTA   TEMP
        SACH  LY4,1
30 *
        ZALH  LY1           PROCESS LOW-GROUP FREQUENCY BINS
        SUBH  LY2
        ADDH  LY3
        SUBH  LY4
35      SACH  LY,0          STORE LOW-GROUP BANDPASS FILTER OUTPUT

*
   *    DTMF HIGH-GROUP BANDPASS FILTER
   *
40      ZAC
        MPY   HS            SCALE INPUT DATA.
        LTA   H1N2          LOAD RESULT INTO THE ACCUMULATOR.
        SACH  X,1           STORE IN LOCATION X
   *
45      LAC   X,15
        MPY   H1D
        LTD   H1N1
        MPY   H1C
        APAC
 5      SACH  HY1,1
        LTA   HY1
        SACH  H1N1,1
        MPY   HS1
        PAC
10      LTA   H2N2
   *    SACH  HY1,1
        LAC   X,15
        MPY   H2D
        LTD   H2N1
```

```
15          MPY   H2C
            APAC
            SACH  HY2,1
            LTA   HY2
            SACH  H2N1,1
20          MPY   HS2
            PAC
            LTA   H3N2
            SACH  HY2,1
    *
25          LAC   X,15
            MPY   H3D
            LTD   H3N1
            MPY   H3C
            APAC
30          SACH  HY3,1
            LTA   HY3
            SACH  H3N1,1
            MPY   HS3
            PAC
35          LTA   H4N2
            SACH  HY3,1
    *
            LAC   X,15
            MPY   H4D
40          LTD   H4N1
            MPY   H4C
            APAC
            SACH  HY4,1
            LTA   HY4
45          SACH  H4N1,1
            MPY   HS4
            PAC
            APA
            SAC       ,1
    *
5           ZAL              PROCESS HIGH-GROUP FREQUENCY BINS
            SUB
            ADD
            SUB
            SAC       )      STORE HIGH-GROUP BANDPASS FILTER OUTPUT
10  *
            RET
    *
    *************  ***********************************************
    *         CODE   PUT ROUTINE                                  *
15  *************  ***********************************************
    *
    CODEC   IN               READ IN CODEC DATA TO CLEAR BIO
            LACK             LOAD MASK >FF FOR BIT-INVERSION
            XOR              PERFORM ONE'S COMPLEMENT ON PCM DATA
20          SACL             STORE LOG-PCM SAMPLE
    *
    *************  ***********************************************
    *         LOG    T PCM TO LINEAR 13-BIT 2'S COMPLEMENT        *
    *************  ***********************************************
25  *
            LACK
```

```
              AND              COMPUTE ADDRESS IN CONVERSION TABLE
              ADD     BL,0     ADD BASE ADDRESS OF TABLE
              TBLF             GET TABLE VALUE
      *
              LACK             CHECK SIGN OF LINEAR PCM VALUE
              AND
              BZ      T        SIGN IS CORRECT
              ZAC
              SUB              CHANGE SIGN IF NEGATIVE
              SAC
      *
      CDRET   RET              RETURN TO MAIN ROUTINE
      *
      ***************  *********************************************
      *        CODE    LINEAR CONVERSION TABLE                     *
      ***************  *********************************************
      *
      CODADD  DATA
              DATA
              DATA
              DATA  24                    DATA 716
              DATA  32                    DATA 748
              DATA  40                    DATA 780
              DATA  48                    DATA 812
              DATA  56                    DATA 844
              DATA  64                    DATA 876
              DATA  72                    DATA 924
              DATA  80
              DATA  88
              DATA  96
              DATA 104
              DATA 112
              DATA 120
              DATA 132
              DATA 148
              DATA 164
              DATA 180
              DATA 196
              DATA 212
              DATA 228
              DATA 244
              DATA 260
              DATA 276
              DATA 292
              DATA 308
              DATA 324
              DATA 340
              DATA 356
              DATA 372
              DATA 396
              DATA 428
              DATA 460
              DATA 492
              DATA 524
              DATA 556
              DATA 588
              DATA 620
              DATA 652
              DATA 684
```

```
DATA 988
DATA 1052
DATA 1116
DATA 1180
DATA 1244
DATA 1308
DATA 1372
DATA 1436
DATA 1500
DATA 1564
DATA 1628
DATA 1692
DATA 1756
DATA 1820
DATA 1884
DATA 1980
DATA 2108
DATA 2236
DATA 2364
DATA 2492
DATA 2620
DATA 2748
DATA 2876
DATA 3004
DATA 3132
DATA 3260
DATA 3388
DATA 3516
DATA 3644
DATA 3772
DATA 3900
DATA 4092
DATA 4348
DATA 4604
DATA 4860
DATA 5116
DATA 5372
DATA 5628
DATA 5884
DATA 6140
DATA 6396
DATA 6652
DATA 6908
DATA 7164
DATA 7420
DATA 7676
DATA 7932
DATA 8316
DATA 8828
DATA 9340
DATA 9852
DATA 10364
DATA 10876
DATA 11388
DATA 11900
DATA 12412
DATA 12924
DATA 13436
DATA 13948
DATA 14460
DATA 14972
DATA 15484
DATA 15996
DATA 16764
DATA 17788
DATA 18812
DATA 19836
DATA 20860
DATA 21884
DATA 22908
DATA 23932
DATA 24956
DATA 25980
DATA 27004
DATA 28028
DATA 29052
DATA 30076
DATA 31100
DATA 32124
END
```

What is claimed is:

1. Apparatus for recognizing a pattern in an input signal, comprising:
 a digital filter for generating a temporal energy signal and a plurality of spectral energy signals for each of a plurality of predetermined sampling periods in response to receiving said input signal;
 a time-domain test template generator for receiving said temporal energy signal and operable to generate a time-domain test template in response thereto;
 a frequency-domain test template generator for receiving said spectral energy signals operable to generate a frequency-domain test template in response thereto; and
 a pattern recognizer coupled to said test template generators for comparing at least one time-domain reference template to said time-domain test template and for comparing at least one frequency-domain reference template to said frequency-domain test template, said recognizer indicating recognition of a pattern upon a predetermined match of said templates; and
 wherein said time-domain test template generator comprises an accumulator for accumulating said temporal energy signals for each of a plurality of time intervals, each interval comprising a plurality of said sampling periods.

2. The apparatus of claim 1 wherein said analyzer is operable to generate said time-domain reference template from said time-domain test template and a plurality of known reference ratios from a predetermined acceptable digital bandpass filter response, said ratios including a first ratio of the accumulated energy for one interval of said predetermined response to the accumulated energy for an immediately preceding interval of said predetermined response, and a second ratio of accumulated energy for an interval subsequent to said one interval to the accumulated energy of said one interval.

3. Apparatus for recognizing a pattern in an input signal, comprising:
 a digital filter for generating a temporal energy signal and a plurality of spectral energy signals for each of a plurality of predetermined sampling periods in response to receiving said input signal;
 a time-domain test template generator for receiving said temporal energy signal and operable to generate a time-domain test template in response thereto;
 a frequency-domain test template generator for receiving said spectral energy signals operable to generate a frequency-domain test template in response thereto;

LOW-GROUP ADAPTIVE NOISE ENERGY CHECK

If there is too much energy in all four frequency bins, the signal is rejected and no DTMF tone is recognized.

HIGH-GROUP TONE DECODE, CALCULATE ADAPTIVE NOISE FLOOR/ENERGY FOR HIGH-GROUP, CHECK FOR PRESENCE OF ONLY ONE TONE IN HIGH-GROUP

These sub-modules are identical to the corresponding low-group sub-modules discussed immediately above with appropriate changes in the variable names.

SUBROUTINE H DIGIT (LOOK UP DECODED HEX DIGIT FROM HEX TABLE)

This subroutine uses a table to look up the hex digit decoded from the table.

SUBROUTINE JB EDIT (OUTPUT DECODED HEX DIGIT)

This subroutine outputs the hexadecimal digit to display hardware.

SUBROUTINE HILOW (LOW-GROUP/HIGH-GROUP BANDPASS FILTERS)

This subroutine corresponds to blocks 14 and 16 in FIG. 1, and contains the bandpass filters for the low- and high-frequency groups. The filter taps provide the second-order outputs and the eighth-order results are obtained in this subroutine also.

SUBROUTINE CODEC (CODEC INPUT ROUTINE)

This subroutine reads in the PCM data from the CODEC and performs the logarithmic-to-linear 13-bit two's complement conversion using the CODEC-to-linear conversion table.

a pattern recognizer coupled to said test template generators for comparing at least one time-domain reference template to said time-domain test template and for comparing at least one frequency-domain reference template to said frequency-domain test template, said recognizer indicating recognition of a pattern upon a predetermined match of said templates; and
 a data adaptive threshold generator operable to select a peak temporal energy value from one of a selected plurality of temporal energy samples transmitted from said filter, said threshold generator operable to determine a temporal energy threshold as a function of said peak energy value and to communicate said threshold to said time-domain test template generator.

4. Apparatus for recognizing a pattern in an input signal, comprising:
 a digital filter for generating a temporal energy signal and a plurality of spectral energy signals for each of a plurality of predetermined sampling periods in response to receiving said input signal;
 a time-domain test template generator for receiving said temporal energy signal and operable to generate a time-domain test template in response thereto;
 a frequency-domain test template generator for receiving said spectral energy signals operable to generate a frequency-domain test template in response thereto;
 a pattern recognizer coupled to said test template generators for comparing at least one time-domain reference template to said time-domain test template and for comparing at least one frequency-domain reference template to said frequency-domain test template, said recognizer indicating recognition of a pattern upon a predetermined match of said templates; and
 wherein said frequency-domain test template generator includes a plurality of counters operable to count numbers of times that spectral energy signals exceed at least one spectral energy signal threshold, each counter operable to store a sum of counts for each spectral energy signal.

5. The apparatus of claim 4 further comprising a data adaptive threshold generator for generating at least one spectral energy signal threshold as a function of a peak temporal energy value selected from a plurality of said temporal energy samples transmitted by said filter, said threshold generator coupled to said frequency-domain test template generator for transmitting said spectral energy signal threshold thereto.

6. Apparatus for recognizing a pattern in an input signal, comprising:
   a digital filter for generating a temporal energy signal and a plurality of spectral energy signals for each of a plurality of predetermined sampling periods in response to receiving said input signal;
   a time-domain test template generator for receiving said temporal energy signal and operable to generate a time-domain test template in response thereto;
   a frequency-domain test template generator for receiving said spectral energy signals operable to generate a frequency-domain test template in response thereto;
   a pattern analyzer coupled to said test template generators for comparing at least one time-domain reference template to said time-domain test template and for comparing at least one frequency-domain reference template to said frequency-domain test template, said analyzer indicating recognition of a pattern upon a predetermined match of said templates; and
   wherein said analyzer includes a reference template generator for generating a frequency-domain reference template for comparison to said frequency-domain test template.

7. Apparatus for recognizing a pattern in an input signal, comprising:
   a digital filter for generating a temporal energy signal and a plurality of spectral energy signals for each of a plurality of predetermined sampling periods in response to receiving said input signal;
   a time-domain test template generator for receiving said temporal energy signal and operable to generate a time-domain test template in response thereto;
   a frequency-domain test template generator for receiving said spectral energy signals operable to generate a frequency-domain test template in response thereto;
   a pattern analyzer coupled to said test template generators for comparing at least one time-domain reference template to said time-domain test template and for comparing at least one frequency-domain reference template to said frequency-domain test template, said analyzer indicating recognition of a pattern upon a predetermined match of said templates; and
   wherein said analyzer includes a reference template storer for storing a plurality of preprogrammed acceptable time-domain reference ratios for comparison to time-domain test templates.

8. Apparatus for recognizing a pattern in an input signal, comprising:
   a digital filter for generating a temporal energy signal and a plurality of spectral energy signals for each of a plurality of predetermined sampling periods in response to receiving said input signal;
   a time-domain test template generator for receiving said temporal energy signal and operable to generate a time-domain test template in response thereto;
   a frequency-domain test template generator for receiving said spectral energy signals operable to generate a frequency-domain test template in response thereto;
   a pattern analyzer coupled to said test template generators for comparing at least one time-domain reference template to said time-domain test template and for comparing at least one frequency-domain reference template to said frequency-domain test template, said analyzer indicating recognition of a pattern upon a predetermined match of said templates; and
   wherein said analyzer further includes a data adaptive noise floor generator for generating a frequency-domain noise floor as a function of the highest accumulated spectral energy signal, said analyzer operable to reject said test templates if more than one of said spectral energy signals exceeds said noise floor.

9. A method of recognizing a pattern in an input signal comprising the steps of:
   generating a temporal energy signal and a plurality of spectral energy signals for each of a plurality of sampling periods in response to receiving an input signal;
   generating a time-domain test template in response to a plurality of the temporal energy signals;
   generating a frequency-domain test template in response to a plurality of the spectral energy signals;
   comparing the time-domain test template to at least one time-domain reference template;
   comparing the frequency-domain test template to at least one frequency-domain reference template;
   recognizing a pattern upon a predetermined degree of match between the test templates and the respective reference templates; and
   accumulating the temporal energy signals for each of a plurality of sampling periods to generate the time-domain test templates.

10. The method of claim 9 and further comprising the step of generating at least one time-domain reference template based on:
    a set of known intermember ratios of the members of a time-domain template representing a predetermined acceptable transient bandpass filter response; and
    said time-domain test template.

11. A method of recognizing a pattern in an input signal comprising the steps of:
    generating a temporal energy signal and a plurality of spectral energy signals for each of a plurality of sampling periods in response to receiving an input signal;
    generating a time-domain test template in response to a plurality of the temporal energy signals;
    generating a frequency-domain test template in response to a plurality of the spectral energy signals;
    comparing the time-domain test template to at least one time-domain reference template;
    comparing the frequency-domain test template to at least one frequency-domain reference template;
    recognizing a pattern upon a predetermined degree of match between the test templates and the respective reference templates; and
    wherein said step of generating the frequency-domain test templates comprises the step of counting numbers of times that the magnitudes of said spectral energy signals exceed a calculated threshold for each group to produce a number of counts for each of the spectral components.

12. The method of claim 11 further comprising the step of generating the threshold for each group as a function of the peak of said temporal energy signals over a plurality of sampling periods.

13. The method of claim 12 and further comprising the step of generating a frequency-domain reference template as a function of the maximum count in each of the test templates over a plurality of sampling periods.

14. A method of recognizing a pattern in an input signal comprising the steps of:
generating a temporal energy signal and a plurality of spectral energy signals for each of a plurality of sampling periods in response to receiving an input signal;
generating a time-domain test template in response to a plurality of the temporal energy signals;
generating a frequency-domain test template in response to a plurality of the spectral energy signals;
comparing the time-domain test template to at least one time-domain reference template;
comparing the frequency-domain test template to at least one frequency-domain reference template;
recognizing a pattern upon a predetermined degree of match between the test templates and the respective reference templates; and
wherein said step of generating the time-domain test templates comprises the step of accumulating the temporal energy signals in each of a plurality of adjacent intervals, each interval including a plurality of sampling periods.

15. The method of claim 14 further comprising the steps of:
storing a plurality of intermember reference ratios predetermined from the members of a time-domain template corresponding to an acceptable transient bandpass filter response;
generating a time-domain reference template based on said stored reference ratios and one of said time-domain test templates; and
comparing the time-domain reference template to the time-domain test template in determining whether a valid pattern is present.

16. Apparatus for recognizing a changing pattern in an input signal, comprising:
a digital filter for generating a transient temporal energy signal and a plurality of transient spectral energy signals for each of a plurality of predetermined sampling periods in response to receiving said changing pattern input signal;
a time-domain test template generator for receiving said transient temporal energy signal and operable to generate at least one transient time-domain test template in response thereto;
a frequency-domain test template generator for receiving said spectral energy signals and operable to generate at least one transient frequency-domain test template in response thereto; and
a pattern recognizer coupled to said test template generators for comparing at least one transient time-domain reference template to at least one of said transient time-domain test templates and for comparing at least one transient frequency-domain reference template to at least one of said transient frequency-domain test templates, said recognizer indicating recognition of said changing pattern upon a predetermined match of said templates.

17. The apparatus set forth in claim 16 further comprising:
a decimating circuit for modifying the sample rate of said transient temporal energy signals so as to modify the throughput of said apparatus.

18. The apparatus set forth in claim 16 further comprising:
a decimating circuit for modifying the sample rate of said transient spectral energy signals so as to modify the throughput of said apparatus.

19. The apparatus set forth in claim 16 further comprising:
a decimating circuit for modifying the sample rate of said transient temporal energy signals so as to modify the throughput of said apparatus; and
a decimating circuit for modifying the sample rate of said transient spectral energy signals so as to modify the throughput of said apparatus.

20. The apparatus of claim 16 further comprising a data adaptive threshold generator operable to select a peak temporal energy value form one of a selected plurality of temporal energy samples transmitted from said filter, said threshold generator operable to determine a temporal energy threshold as a function of said peak energy value and to communicate said threshold to said time-domain test template generator.

21. The apparatus of claim 16 wherein said digital filter includes a multifrequency recursive bandpass filter having a plurality of center frequencies used to generate said temporal and said spectral energy signals.

22. The apparatus of claim 21 wherein said recursive filter further includes:
an equalization circuit for providing equalization of distortions of said input signal across all said center frequencies.

23. The apparatus of claim 21 wherein said recursive filter has four center frequencies and the transfer function of:

$$H(z) = S.H_1(z).S_1 - S.H_2(z).S_2 + S.H_3(z).S_3 - S.H_4(z).S_4.$$

24. A method for recognizing a changing pattern in an input signal comprising the steps of:
generating a transient temporal energy signal and a plurality of transient spectral energy signals for each of a plurality of predetermined sampling periods in response to receiving said changing pattern input signal;
generating at least one transient time-domain test template in response thereto;
generating at least one transient frequency-domain test template in response thereto; and
comparing at least one transient time-domain reference template to at least one of said transient time-domain test templates and for comparing at least one transient frequency-domain reference template to at least one of said transient frequency-domain test templates to indicate recognition of said changing pattern upon a predetermined match of said templates.

25. The method set forth in claim 24 further comprising the steps of:
modifying the sample rate of said transient temporal energy signals so as to modify the throughput of said method.

26. The method set forth in claim 24 further comprising the steps of:
modifying the sample rate of said transient spectral energy signals so as to modify the throughput of said method.

27. The method set forth in claim 24 further comprising the steps of:

modifying the sample rate of said transient temporal energy signals so as to modify the throughput of said apparatus; and modifying the sample rate of said transient spectral energy signals so as to modify the throughput of said apparatus 28. The method set forth in claim 24 further comprising the steps of:

selecting, via a data adaptive threshold generator, a peak temporal energy value from one of a selected plurality of temporal energy samples transmitted from said filter;

determining a temporal energy threshold as a function of said peak energy value; and communicating said threshold to a time-domain test template generator.

29. The method set forth in claim 24 further comprising the steps of:

using a multifrequency recursive bandpass filter having a plurality of center frequencies; and generating said temporal and said spectral energy signals using a multifrequency recursive bandpass filter having a plurality of center frequencies.

30. The method set forth in claim 29 wherein said generating step includes the steps of:

providing equalization of distortions of said input signal across all said center frequencies.

31. The method set forth in claim 29 wherein said recursive filter has four center frequencies and the transfer function of:

$$H(z) = S.H_1(z).S_1 - S.H_2(z).S_2 + S.H_3(z).S_3 - S.H_4(z).S_4.$$

32. Apparatus for recognizing a changing pattern in an input signal having predetermined frequencies comprising:

a digital bandpass filter having a plurality of frequency bins, each bin incorporating a transfer function for preferentially transmitting frequencies of an input signal near one of said predetermined frequencies, each frequency bin accumulating the transient portion of a spectral energy signal for each of a plurality of filter sampling periods and deriving a transient temporal energy signal as a function of said preferentially transmitted frequencies for each of said sampling periods;

a time-domain test template generator coupled to said filter for receiving said transient temporal energy signal and generating a transient time-domain test template in response thereto;

a frequency-domain test template generator coupled to said filter for receiving the transient portion of said spectral energy signals and generating a transient frequency-domain test template in response thereto; and an analyzer coupled to said template generators for comparing at least one transient frequency-domain test template to at least one transient frequency-domain reference template and for comparing said transient time-domain test template to at least one transient time-domain reference template, said analyzer indicating recognition of a valid pattern upon a predetermined match of said templates.

33. The apparatus set forth in claim 32 further comprising:

a decimating circuit for modifying the sample rate of said transient temporal energy signals so as to modify the throughput of said apparatus.

34. The apparatus set forth in claim 32 further comprising:

a decimating circuit for modifying the sample rate of said transient spectral energy signals so as to modify the throughput of said apparatus.

35. The apparatus set forth in claim 32 further comprising:

a decimating circuit for modifying the sample rate of said transient temporal energy signals so as to modify the throughput of said apparatus; and a decimating circuit for modifying the sample rate of said transient spectral energy signals so as to modify the throughput of said apparatus.

36. The apparatus of claim 32 further comprising a data adaptive threshold generator operable to select a peak temporal energy value from one of a selected plurality of temporal energy samples transmitted from said filter, said threshold generator operable to determine a temporal energy threshold as a function of said peak energy value and to communicate said threshold to said time-domain test template generator.

37. The apparatus set forth in claim 32 wherein said digital filter includes a multifrequency recursive bandpass filter having a plurality of center frequencies used to generate said temporal and said spectral energy signals.

38. The apparatus set forth in claim 37 wherein said recursive filter further includes:

an equalization circuit for providing equalization of distortions of said input signal across all said center frequencies.

39. The apparatus of claim 37 wherein said recursive filter has four center frequencies and the transfer function of:

$$H(z) = S.H_1(z).S_1 - S.H_2(z).S_2 + S.H_3(z).S_3 - S.H_4(z).S_4.$$

40. A multifrequency recursive digital bandpass filter having a plurality of center frequencies, said recursive filter operative for generating a temporal energy signal and a plurality of spectral energy signals for each of a plurality of predetermined sampling periods in response to receiving said input signal, said recursive filter for use in a pattern recognition system, said system including:

a time-domain test template generator for receiving said temporal energy signal and operable to generate a time-domain test template in response thereto;

a frequency-domain test template generator for receiving said spectral energy signals and operable to generate a frequency-domain test template in response thereto;

a pattern recognizer coupled to said test template generators for comparing at least one time-domain reference template to said time-domain test template and for comparing at least one frequency-domain reference template to said frequency-domain test template, said recognizer indicating recognition of a pattern upon a predetermined match of said templates; and wherein said recursive filter with a plurality of center frequencies are used to generate said temporal and said spectral energy signals.

41. The filter set forth in claim 40 further comprising:

an equalization circuit for providing equalization of distortions of said input signal across all said center frequencies.

42. The filter set forth in claim 41 wherein said filter as four center frequencies having the transfer function of:

$$H(z) = S.H_1(z).S_1 - S.H_2(z).S_2 + S.H_3(z).S_3 - S.H_4(z).S_4.$$

* * * * *